US012735838B2

(12) United States Patent
Padilla, Jr. et al.

(10) Patent No.: US 12,735,838 B2
(45) Date of Patent: Sep. 15, 2026

(54) THERMAL INTERFACE MATERIALS COMPRISING ALIGNED FIBERS AND MATERIALS SUCH AS SOLDER, ALLOYS, AND/OR OTHER METALS

(71) Applicant: Boston Materials, Inc., Billerica, MA (US)

(72) Inventors: Rafael Padilla, Jr., San Leandro, CA (US); Chunzhou Pan, Quincy, MA (US)

(73) Assignee: Boston Materials, Inc., Billerica, MA (US)

(*) Notice: Subject to any disclaimer, the term of this patent is extended or adjusted under 35 U.S.C. 154(b) by 534 days.

(21) Appl. No.: 18/446,581

(22) Filed: Aug. 9, 2023

(65) Prior Publication Data

US 2024/0052558 A1 Feb. 15, 2024

Related U.S. Application Data

(60) Provisional application No. 63/398,190, filed on Aug. 15, 2022.

(51) Int. Cl.
*D06M 11/83* (2006.01)
*B23K 35/365* (2006.01)
(Continued)

(52) U.S. Cl.
CPC ........... *D06M 11/83* (2013.01); *B23K 35/365* (2013.01); *C23C 16/06* (2013.01); *D06M 2101/40* (2013.01); *D10B 2101/12* (2013.01)

(58) Field of Classification Search
None
See application file for complete search history.

(56) References Cited

U.S. PATENT DOCUMENTS 4,025,911 A 5/1977 Bobeck et al.
4,481,249 A 11/1984 Ebneth et al.
(Continued)

FOREIGN PATENT DOCUMENTS

CN 1784516 A 6/2006
CN 1894435 A 1/2007
(Continued)

OTHER PUBLICATIONS

Solder Alloys by Indium Corporation, https://www.indium.com/products/alloys/solder-alloys/ (Year: 2026).*
(Continued)

*Primary Examiner* — Jennifer A Boyd

(57) ABSTRACT

The present disclosure is generally directed to a variety of thermally conductive materials for use in semiconductor devices or other applications. In some cases, the materials may include aligned fibers such as carbon fibers, e.g., defining a substrate, and a metal such as solder. In some cases, the metal may be present within a transition metal rich solder alloy, a conductive medium such as a conductive ink, a thermal chemical vapor deposited solder, an oxide coated liquid metal, an oxide coated liquid metal transition metal rich solder alloy, etc. The metal may have a relatively low melting temperature in certain embodiments. The metal may be interspersed or infiltrated between the plurality of discontinuous fibers, and/or surround at least some of the fibers. In some cases, the metal may react with the carbon fibers to form metal carbides and/or diffuse into the carbon fibers, which may facilitate contact between the metal and the carbon fibers. Other aspects are generally directed to devices using such compositions, methods of making such compositions, kits including such compositions, or the like.

17 Claims, 3 Drawing Sheets

(51) Int. Cl.
*C23C 16/06* (2006.01)
*D06M 101/40* (2006.01)

(56) References Cited

U.S. PATENT DOCUMENTS 4,523,628 A 6/1985 Vives
5,432,000 A 7/1995 Young et al.
5,876,540 A 3/1999 Pannell
5,968,639 A 10/1999 Childress
6,837,306 B2 * 1/2005 Houle ................ H10W 40/037 428/297.4
7,073,538 B2 7/2006 Bhatnagar et al.
7,409,757 B2 8/2008 Hall et al.
7,439,475 B2 10/2008 Ohta
7,537,825 B1 5/2009 Wardle et al.
7,655,581 B2 2/2010 Goering
7,663,242 B2 * 2/2010 Lewis .................. H10W 40/70 257/772
7,803,262 B2 9/2010 Haik et al.
7,832,983 B2 11/2010 Kruckenberg et al.
7,951,464 B2 5/2011 Roberts
8,173,857 B1 5/2012 Yananton
8,197,888 B2 6/2012 Sue et al.
8,575,045 B1 11/2013 McKnight et al.
8,790,565 B2 7/2014 Miller
8,889,761 B2 11/2014 Studart et al.
9,312,046 B2 4/2016 Hong et al.
9,388,577 B2 7/2016 Kromer et al.
9,394,196 B2 7/2016 Peters et al.
9,732,463 B2 8/2017 Carter et al.
9,892,835 B2 2/2018 Hong et al.
9,896,783 B2 2/2018 Kia
11,479,656 B2 10/2022 Soheilian et al.
11,767,415 B2 9/2023 Soheilian et al.
11,820,880 B2 11/2023 Gurijala et al.
11,840,028 B2 12/2023 Mone et al.
12,428,587 B1 9/2025 Stagon et al.
2005/0058805 A1 3/2005 Kimura et al.
2005/0061496 A1 3/2005 Matabayas, Jr.
2005/0175813 A1 8/2005 Wingert et al.
2005/0228097 A1 10/2005 Zhong et al.
2005/0239948 A1 10/2005 Haik et al.
2006/0157223 A1 7/2006 Gelorme et al.
2006/0286361 A1 12/2006 Yonetake et al.
2008/0145647 A1 6/2008 Ganguli et al.
2008/0274326 A1 11/2008 Kim et al.
2009/0117269 A1 5/2009 Hansen et al.
2009/0227162 A1 9/2009 Kruckenberg et al.
2010/0040902 A1 2/2010 Mizrahi
2010/0128439 A1 5/2010 Tilak et al.
2010/0196688 A1 8/2010 Kritzer et al.
2010/0320320 A1 12/2010 Kismar et al.
2011/0186775 A1 8/2011 Shah et al.
2012/0107599 A1 5/2012 Yonetake et al.
2012/0289107 A1 11/2012 Beissinger et al.
2013/0053471 A1 2/2013 Studart et al.
2013/0252497 A1 9/2013 Schiebel et al.
2013/0316148 A1 11/2013 Gunnink
2014/0110049 A1 4/2014 Yuen et al.
2014/0250665 A1 9/2014 Choi et al.
2014/0342630 A1 11/2014 Amtmann et al.
2015/0168087 A1 6/2015 Kim et al.
2015/0228388 A1 8/2015 Hong et al.
2016/0055930 A1 2/2016 Humfeld
2016/0083535 A1 3/2016 Wilenski et al.
2016/0169009 A1 6/2016 Okamoto et al.
2016/0340482 A1 11/2016 Williams et al.
2017/0067186 A1 3/2017 Kia
2017/0101730 A1 4/2017 Gilbertson
2017/0135227 A1 * 5/2017 Ramakrishna ....... H05K 3/3489
2017/0173895 A1 6/2017 Williams
2017/0182700 A1 6/2017 Brady
2017/0240715 A1 8/2017 Hsiao et al.
2017/0338497 A1 11/2017 Tatsuno et al.
2018/0016420 A1 1/2018 Fujimaki
2018/0016740 A1 1/2018 Kia et al.
2019/0048500 A1 2/2019 Tierney et al.
2020/0024795 A1 1/2020 Gurijala et al.
2020/0066614 A1 2/2020 Cola et al.
2021/0008840 A1 1/2021 Gurijala et al.
2021/0009789 A1 1/2021 Soheilian et al.
2022/0001631 A1 1/2022 Mone et al.
2023/0002591 A1 1/2023 Soheilian et al.
2023/0272256 A1 8/2023 Pan et al.
2026/0062598 A1 3/2026 Stagon et al.

FOREIGN PATENT DOCUMENTS

CN 1906234 A 1/2007
CN 1950200 A 4/2007
CN 101224601 A 7/2008
CN 103109330 A 5/2013
CN 105073848 A 11/2015
CN 105390210 A 3/2016
CN 105690802 A 6/2016
CN 105734535 A 7/2016
CN 105980512 A 9/2016
CN 106460312 A 2/2017
CN 107107537 A 8/2017
CN 110828828 A 2/2020
CN 108251063 B 5/2021
EP 2013408 A2 1/2009
EP 2085215 A1 8/2009
EP 2883930 A1 6/2015
EP 3184288 A1 6/2017
GB 1438509 A 6/1976
JP S49-26381 A 3/1974
JP S57-149551 A 9/1982
JP S60-082332 A 5/1985
JP S63-295751 A 12/1988
JP 07-197311 A 8/1995
JP 07-331358 A 12/1995
JP 2000-281802 A 10/2000
JP 2003-301048 A 10/2003
JP 2004-051853 A 2/2004
JP 2004-103403 A 4/2004
JP 2004-276478 A 10/2004
JP 2004-360160 A 12/2004
JP 2006-335957 A 12/2006
JP 2007-009363 A 1/2007
JP 2008-266586 A 11/2008
JP 2013-023801 A 2/2013
JP 2015-063664 A 4/2015
JP 2016-044302 A 4/2016
JP 2016-064648 A 4/2016
JP 2018-523599 A 8/2018
JP 2021-008369 A 1/2021
JP 2022-512188 A 2/2022
WO WO 2001/025514 A1 4/2001
WO WO 2005/085334 A2 9/2005
WO WO 2007/130979 A2 11/2007
WO WO 2009/009207 A2 1/2009
WO WO 2011/100734 A1 8/2011
WO WO 2017/027699 A1 2/2017
WO WO 2018/175134 A1 9/2018
WO WO 2020/123334 A1 9/2018
WO WO 2021/007381 A1 1/2021
WO WO 2021/007389 A1 1/2021
WO WO 2023/163848 A2 8/2023
WO WO 2024/039598 A1 2/2024

OTHER PUBLICATIONS

Chinese Office Action for Application No. 20188003308.2 mailed Jun. 29, 2021.
Chinese Office Action for Application No. 20188003308.2 mailed Jan. 24, 2022.
Chinese Office Action for Application No. 201880033308.2 mailed Jul. 29, 2022.
Extended European Search Report for Application No. 18770244.4 mailed Dec. 3, 2020.
European Office Action mailed Nov. 21, 2022 for Application No. 18770244.4.

(56) References Cited

OTHER PUBLICATIONS

Japanese Office Action for Application No. 2020-500780 mailed Feb. 15, 2022.
Japanese Office Action for Application No. 2020-500780 mailed Jun. 28, 2022.
International Search Report and Written Opinion for Application No. PCT/US2018/021975 mailed May 24, 2018.
International Preliminary Report on Patentability for Application No. PCT/US2018/021975 mailed Oct. 3, 2019.
Chinese Office Action for Application No. 2019800800347 mailed Feb. 16, 2022.
Chinese Office Action for Application No. 2019800800347 mailed Jun. 28, 2022.
Chinese Office Action mailed Jan. 10, 2023, for Application No. CN201980080034.7.
Extended European Search Report for Application No. 19896171.6 mailed Aug. 16, 2022.
European Office Action mailed Jul. 14, 2023, for Application No. 19896171.6.
Japanese Office Action mailed Sep. 5, 2023, for Application No. JP2021-532970.
International Search Report and Written Opinion for Application No. PCT/US2019/065142 mailed Mar. 10, 2020.
International Preliminary Report on Patentability for Application No. PCT/US2019/065142 mailed Jun. 24, 2021.
Invitation to Pay Additional Fees for Application No. PCT/US2020/041306 mailed Oct. 29, 2020.
International Search Report and Written Opinion for Application No. PCT/US2020/041306 mailed Dec. 21, 2020.
International Preliminary Report on Patentability for Application No. PCT/US2020/041306 mailed Jan. 20, 2022.
International Search Report and Written Opinion for Application No. PCT/US2020/041322 mailed Oct. 9, 2020.
International Preliminary Report on Patentability for Application No. PCT/US2020/041322 mailed Jan. 20, 2022.
Invitation to Pay Additional Fees for Application No. PCT/US2023/012171 mailed Jun. 23, 2023.
[No Author Listed], Permanent Magnets vs Electromagnets. Adams Magnetic Products. Accessed Sep. 20, 2017. 5 pages.
[No Author Listed], HexTow® IM7 Carbon Fiber. HEXCEL® Product Data Sheet. Jan. 1, 2020. Retrieved from the Internet. 2 pages.
[No Author Listed], New Practical Handbook of Hardware. Ed. Zhenwu, Z. Liaoning Science and Tech Publishing House, Jan. 2015: 1486-7.
Barrett et al., The mechanics of z-fiber reinforcement. Composite Structures. Sep. 1996; 36(1-2): 23-32.
Boden et al., Nanoplatelet size to control the alignment and thermal conductivity in copper-graphite composites. Nano Lett. Jun. 11, 2014;14(6):3640-4. doi: 10.1021/nl501411g. Epub May 22, 2014.
Erb et al., Composites reinforced in three dimensions by using low magnetic fields. Science. Jan. 13, 2012;335(6065):199-204. doi: 10.1126/science.1210822.
Erb et al., Concentration gradients in mixed magnetic and nonmagnetic colloidal suspensions. J Appl Phys. Mar. 7, 2008;103(07A312):1-3.
Erb et al., Magnetic assembly of colloidal superstructures with multipole symmetry. Nature. Feb. 19, 2009;457(7232):999-1002. doi: 10.1038/nature07766.
Erb et al., Non-linear alignment dynamics in suspensions of platelets under rotating magnetic fields. Soft Matter. 2012;8:7604-9.
Gardiner, Z-direction composite properties on an affordable, industrial scale. Composite World. Apr. 20, 2021. <https://www.compositesworld.com/articles/z-direction-composite-properties-on-an-affordable-industrial-scale>. 9 pages.
Hashin, Analysis of the effects of fiber anisotropy on the properties of carbon and graphite fiber composites. J Appl Mech. 1979; 46: 543-50.
Huang, Fabrication and properties of carbon fibers. Materials. Dec. 16, 2009; 2: 2369-403. doi:10.3390/ma2042369.
Jackson et al., Out-of-plane properties. NASA, Langley Research Center Mechanics of Textile Composites Conference. Oct. 1, 1995:315-348.
Kimura et al., Uniaxial alignment of the smallest diamagnetic susceptibility axis using time-dependent magnetic fields. Langmuir. Jul. 6, 2004;20(14):5669-72. doi: 10.1021/la049347w.
Le Ferrand et al., Magnetically assisted slip casting of bioinspired heterogeneous composites. Nat Mater. Nov. 2015;14(11):1172-9. doi: 10.1038/nmat4419. Epub Sep. 21, 2015.
Libanori et al., Mechanics of platelet-reinforced composites assembled using mechanical and magnetic stimuli. ACS Appl Mater Interfaces. Nov. 13, 2013;5(21):10794-805. doi: 10.1021/am402975a. Epub Oct. 25, 2013.
Libanori et al., Ultrahigh magnetically responsive microplatelets with tunable fluorescence emission. Langmuir. Nov. 26, 2013;29(47):14674-80. doi: 10.1021/la4027305. Epub Nov. 15, 2013.
Martin et al., Designing bioinspired composite reinforcement architectures via 3D magnetic printing. Nat Commun. Oct. 23, 2015;6:8641. doi: 10.1038/ncomms9641.
Martin et al., Understanding and overcoming shear alignment of fibers during extrusion. Soft Matter. Jan. 14, 2015;11(2):400-5. doi: 10.1039/c4sm02108h.
Matsuo, Electric, Dielectric and Magnetic Properties of Polymer and Carbon Fillers. International Workshop on Advanced Polymer Science and Turbulent Drag Reduction. Mar. 10-20, 2008. 57 pages.
Matthews et al., Magnetic alignment of mesophase pitch-based carbon fibers. Appl Phys Lett. Jul. 15, 1996;69(3):430-2.
Ooi et al., On the controllability of nanorod alignment in magnetic fluids. Journal of Applied Physics. Feb. 7, 2008;103(07E910):1-3.
Sander et al., High-performance battery electrodes via magnetic templating. Nature Energy. Aug. 2016;1:1-7.
Sato et al., Recent trend of carbon fiber technology from mesophase pitch (part 1)—the new method for high performance and improved properties. TANSO. 1993; 157: 107-19. Japanese.
Sherman et al., Fiber sizings: coupling agent companions. CompositesWorld. Aug. 1, 2013. Retrieved from the Internet at URL:https://www.compositesworld.com/articles/fiber-sizings-coupling-agent-companions. Last Accessed Oct. 2, 2020, 1 page.
Sommer et al., Injectable materials with magnetically controlled anisotropic porosity. ACS Appl Mater Interfaces. Oct. 24, 2012;4(10):5086-91. doi: 10.1021/am301500z. Epub Oct. 9, 2012.
Walsh et al., Carbon fibers. Composites. ASM International. 2001; 35-40.
International Search Report and Written Opinion, mailed Jan. 8, 2024 for International Application No. PCT/US2023/030139.
Invitation to Pay Additional Fees for Application No. PCT/US2023/030139 mailed Nov. 16, 2023.
European Office Action mailed Nov. 6, 2023, for Application No. 18770244.4.
Chinese Office Action mailed Nov. 2, 2023, for Application No. 201980080034.7.
Japanese Office Action mailed Mar. 12, 2024, for Application No. JP2021-532970.
Japanese Office Action mailed Oct. 8, 2024, for Application No. JP2021-532970.
Chinese Office Action mailed Mar. 27, 2024, for Application No. 202080065034.2.
European Office Action mailed Jan. 27, 2023, for Application No. 20751409.2.
International Search Report and Written Opinion mailed Aug. 16, 2023, for Application No. PCT/US2023/012171.
International Preliminary Report on Patentability mailed Sep. 12, 2024, for Application No. PCT/US2023/012171.
International Preliminary Report on Patentability mailed Feb. 27, 2025, for Application No. PCT/US2023/030139.
Canadian Office Action issued Feb. 23, 2026 for Application No. 3,255,197.
Taiwanese Office Action mailed Jul. 15, 2025, for Application No. 113139491.
International Search Report and Written Opinion mailed Mar. 10, 2025, for Application No. PCT/US2024/044998.

(56) References Cited

OTHER PUBLICATIONS

[No Author Listed], Standard Test Method for Thermal Transmission Properties of Thermally Conductive Electrical Insulation Materials. Designation D5470-17. ASTM International. Nov. 2017. 6 pages.
Li et al., Carbon nanotube/paraffin/montmorillonite composite phase change material for thermal energy storage. Sol Energy. Apr. 2017;146:1-7. doi: 10.1016/j.solener.2017.02.003.
Xing et al., Ice thermal energy storage enhancement using aligned carbon nanotubes under external magnetic field. J Energy Storage. Dec. 1, 2002;56(Part A):105931. doi: 10.1016/j.est.2022.105931.
PCT/US2023/030139, Jan. 8, 2024, International Search Report and Written Opinion.

* cited by examiner 10
15
20

10
15
20
30

10
15
20
40

THERMAL INTERFACE MATERIALS COMPRISING ALIGNED FIBERS AND MATERIALS SUCH AS SOLDER, ALLOYS, AND/OR OTHER METALS

RELATED APPLICATIONS

This application claims the benefit of U.S. Provisional Patent Application Ser. No. 63/398,190, filed Aug. 15, 2022, entitled "Thermal Interface Materials Comprising Aligned Fibers and Materials Such As Solders, Alloys, and/or Other Metals, incorporated herein by reference in its entirety.

FIELD

The present disclosure is generally directed to a variety of thermally conductive materials for use in semiconductor devices or other applications. In some cases, the materials may include aligned fibers such as carbon fibers, and a metal such as solder.

BACKGROUND

Thermal interface materials are materials that have a relatively low thermal impedance and high thermal conductivity. They can be used, for example, to conduct heat between a first location (e.g., a heat source) and a second location (e.g., a heat sink). A thermal interface material thus can be used to help thermally communicate the first location to the second location. One example of a use of thermal interface material is to dissipate heat in electronic equipment. For example, semiconductor devices in computers often produce significant amount of heat, which could damage the chips or other components. Accordingly, thermal interface materials may be used to help connect semiconductor devices to suitable heat sinks, such as cooling fins. However, many thermal interface materials are inefficient and do not have suitably high thermal conductivities. Thus, improvements are still needed.

SUMMARY

The present disclosure is generally directed to a variety of thermally conductive materials for use in semiconductor devices or other applications. In some cases, the materials may include aligned fibers such as carbon fibers, and a metal such as solder. In some cases, the materials may include aligned fibers such as carbon fibers, and a metal such as solder. The subject matter of the present disclosure involves, in some cases, interrelated products, alternative solutions to a particular problem, and/or a plurality of different uses of one or more systems and/or articles.

In one aspect, the present disclosure is directed to a composition. In one set of embodiments, the composition compares a plurality of discontinuous fibers defining a substrate, and a solder in contact with the plurality of discontinuous fibers. In some cases, at least 30 vol % of the discontinuous fibers within the substrate are substantially aligned.

The composition, in another set of embodiments, comprises a plurality of discontinuous fibers defining a substrate, a metal contacting the plurality of discontinuous fibers. In some cases, the metal has a melting temperature of no more than 265° C. In certain embodiments, at least 30 vol % of the discontinuous fibers within the substrate are substantially aligned The composition, in yet another set of embodiments, comprises a plurality of discontinuous fibers defining a substrate, a metal in contact with the plurality of discontinuous fibers. In certain cases, the plurality of discontinuous fibers is more thermally conductive than the metal. In some embodiments, at least 30 vol % of the discontinuous fibers within the substrate are substantially aligned.

In still another set of embodiments, the composition comprises a plurality of discontinuous fibers defining a substrate, and a carbide in contact with the plurality of discontinuous fibers. In certain embodiments, at least 30 vol % of the discontinuous fibers within the substrate are substantially aligned.

In another set of embodiments, the composition comprises a plurality of discontinuous fibers defining a substrate, and a metal in contact with the plurality of discontinuous fibers. In certain cases, the plurality of discontinuous fibers and the metal together have an internal void volume of no more than 20%. In some embodiments, at least 30 vol % of the discontinuous fibers within the substrate are substantially aligned.

In another aspect, the present disclosure is directed to a method. In one set of embodiments, the method comprises providing a plurality of discontinuous fibers defining a substrate, and exposing at least some of the discontinuous fibers to a solder. In some cases, at least 30 vol % of the discontinuous fibers within the substrate are substantially aligned. The method, in another set of embodiments, comprises providing a plurality of discontinuous fibers defining a substrate, and forcing solder in between the plurality of discontinuous fibers under heat and/or pressure. In some embodiments, at least 30 vol % of the discontinuous fibers within the substrate are substantially aligned.

In another aspect, the present disclosure encompasses methods of making one or more of the embodiments described herein, for example, thermally conductive aligned materials. In still another aspect, the present disclosure encompasses methods of using one or more of the embodiments described herein, for example, thermally conductive aligned materials.

Other advantages and novel features of the present disclosure will become apparent from the following detailed description of various non-limiting embodiments of the disclosure when considered in conjunction with the accompanying figures.

BRIEF DESCRIPTION OF THE DRAWINGS

Non-limiting embodiments of the present disclosure will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the disclosure shown where illustration is not necessary to allow those of ordinary skill in the art to understand the disclosure. In the figures.

DETAILED DESCRIPTION

Figures 1, 2, 3:
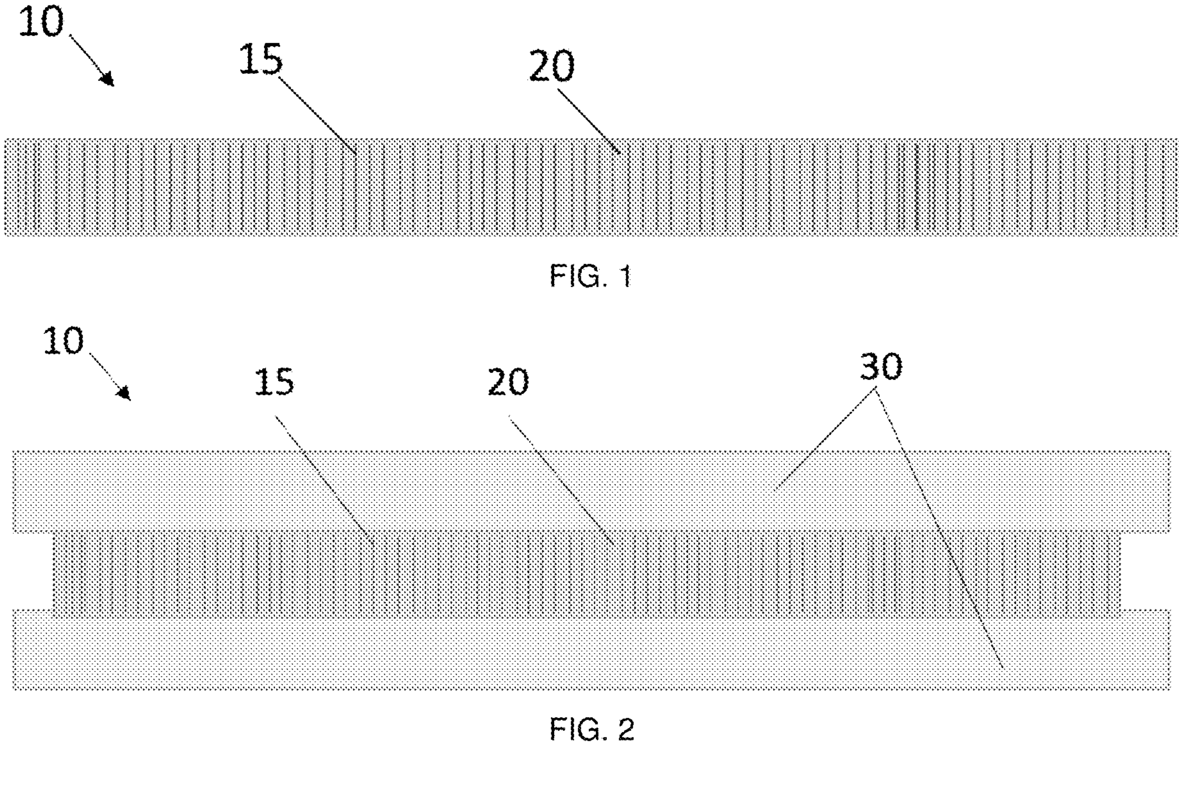
FIG. 1 schematically illustrates a substrate comprising a plurality of substantially aligned fibers, in accordance with one embodiment.
FIG. 2 schematically illustrates a substrate comprising a plurality of substantially aligned fibers between metal plates, in another embodiment.
FIG. 3 schematically illustrates a substrate comprising a plurality of substantially aligned fibers and void volumes, in yet another embodiment.

The present disclosure is generally directed to a variety of thermally conductive materials for use in semiconductor devices or other applications. In some cases, the materials may include aligned fibers such as carbon fibers, e.g., defining a substrate, and a metal such as solder. In some cases, the metal may be present within a transition metal rich solder alloy, a conductive medium such as a conductive ink, a thermal chemical vapor deposited solder, an oxide coated liquid metal, or an oxide coated liquid metal transition metal rich solder alloy, etc. The metal may have a relatively low melting temperature in certain embodiments. The metal may be interspersed or infiltrated between the plurality of discontinuous fibers, and/or surround at least some of the fibers. In some cases, the metal may react with the carbon fibers to form metal carbides and/or diffuse into the carbon fibers, which may facilitate contact between the metal and the carbon fibers. Other aspects are generally directed to devices using such compositions, methods of making such compositions, kits including such compositions, or the like.

For example, certain aspects as discussed herein are generally directed to thermal interface materials (TIM) and compositions. These may be used, for example, to conduct heat between a first location (e.g., a heat source) and a second location (e.g., a heat sink). Such compositions may be positioned between a semiconductor device (e.g., a heat source or a heat generating body) and a heat sink or a cooling apparatus (e.g., a heat radiating body). In some embodiments, thermally conductive carbon fibers can be used to transport heat quickly and efficiently through the material. In addition, in some embodiments, such compositions may be used to provide electromagnetic interference (EMI) shielding, e.g., instead or in addition to thermal transport.

In one set of embodiments, compositions such as those described herein may contain a plurality of discontinuous fibers, which may be substantially aligned in some cases. It should be noted that such alignment need not be perfect, but at least some of the fibers within the composition may generally exhibit an alignment that is within 45o, or within 20o or less of the average alignment of the plurality of the fibers, e.g., as discussed herein. In addition, in some embodiments, such fibers may be substantially aligned at a relatively high volume or packing fraction. For example, the fibers may be present within the composition such that at least 30 vol %, at least 40 vol %, at least 50 vol %, etc. of the composition comprise such fibers. Higher volume percentages are also possible in other embodiments, e.g., as described below. Such fibers, e.g., when substantially aligned, may be particularly effective at transporting heat from a first location and a second location, for example, due to the alignment and directionality of the fibers. In addition, in some cases, the plurality of discontinuous fibers may be more thermally conductive than the metal. In contrast, many other compositions used for thermal interface materials have much lower fiber concentrations or densities, and typically any fibers that may be present cannot transport significant amounts of heat, e.g., due to their low concentrations.

In some embodiments, materials such as metals or solders may be used within the composition. In one set of embodiments, such compositions may be used to ensure good thermal contact between a first location and a second location, e.g., between a heat source and a heat sink or a cooling apparatus. In some cases, the metals may be selected to have a relatively low melting temperature. For example, in one embodiment, the solder may comprise indium, for example, as solder alloys such as InAg, InCr, InNi, InCo, etc. Other examples of solder alloys include SnAgCu alloys, for example 96.5% Sn/3.0% Ag/0.5% Cu (i.e., SAC305), recycled solder alloys, or the like. In some cases, such materials may provide differences in the characteristics of the compositions, such as assembly process temperatures, thermomechanical properties, mechanical properties, CTE (coefficient of thermal expansion), thermal conductivity, thermal resistance, compression strength, handling, environmental impact, solderability, or the like. In some cases, solder flux may also be present, e.g., coated onto the fibers. Solder fluxes may be useful, in some embodiments, to facilitate bonding between the materials and the fibers.

Such materials may contact at least some of the fibers, for example, surrounding at least a portion of the fibers, and/or being interspersed or infiltrated between the fibers. For example, such materials may be infused into the substrate or between the fibers using techniques such as applied pressure, gravity, capillary action, or the like, as discussed in more detail herein. Surprisingly, as discussed herein, certain materials and methods as discussed herein may allow metals such as solders to "wet out" the fibers, e.g., allowing the metal to at least partially cover or surround the fibers. In some cases, this may result in relatively small void volumes, e.g., as discussed herein. In addition, in some cases, additional materials may be coated onto the substrate.

In some embodiments, the presence of substantially aligned discontinuous fibers may reduce or prevent the metal from flowing out of the composition, e.g., when heated to temperatures exceeding the melting temperature of the metal. Without wishing to be bound by any theory, it is believed that the discontinuous fibers may serve as a physical barrier that reduces or prevents the metal from flowing out of the composition. In addition, as discussed herein, the metal may partially "wet out" the fibers. Furthermore, in some cases, the fibers may be substantially incompressible, for instance, when subjected to force or weight, thereby preventing or reducing the ability to such forces or weight to cause movement of the metal. For example, in some cases, the fibers may reduce or inhibit the metal from being forced, squeezed, or bled out of, e.g., during assembly or use of the composition. As a non-limiting example, one schematic of such a composition can be seen in FIG. 1 in accordance with certain aspects as discussed herein, where substrate 10 includes a plurality of fibers 15 that are substantially aligned, and a material 20 that surrounds and is interspersed between the fibers. For example, the fibers may include carbon fibers, and/or the material may be a metal such as solder (e.g., a solder containing indium). In addition, in some embodiments, the composition may be contained between metal plates (for example, comprising copper or other metals), e.g., as part of a thermal interface material able to conduct heat from a first location (e.g., a heat source) to a second location (e.g., a heat sink or a cooling apparatus). In some cases, the metal plates may be substantially parallel. This can be seen schematically in the example of FIG. 2 with plates 30. Plates 30 may be, for example, lids, dies, or other components, e.g., within a device.

In addition, in some embodiments, it should be understood that the material may not be perfectly interspersed between the fibers, e.g., there may be some void volumes created between the plurality of discontinuous fibers and the material. This is shown schematically in FIG. 3 with void volume 40. However, in some embodiments as discussed herein, the internal void volume may be no more than 40%, no more than 30%, no more than 20%, etc., as in certain cases, relatively high amounts of infiltration between the fibers by the material may be achieved, for example, as described herein. Such compositions may still exhibit relatively high thermal conductivities, e.g., due to the presence of the plurality of discontinuous fibers passing through the void volumes, and/or due to the relatively small void volumes that may be present.

The above discussion is a non-limiting example of certain embodiment of the present invention that can be used to produce certain thermally conductive aligned materials. However, other embodiments are also possible. Accordingly, more generally, various aspects of the invention are directed to various systems and methods for aligned materials.

For example, some aspects are generally directed to compositions that can conduct heat between a first location (e.g., a heat source) and a second location (e.g., a heat sink). In certain instances, the composition may be used as a thermal interface material that can be used to help thermally communicate the first location to the second location. In one set of embodiments, a composition such as discussed herein may have relatively high thermal conductivity. For example, the composition may have an overall heat conductivity of at least 3 W/m K, at least 5 W/m K, at least 10 W/m K, at least 20 W/m K, at least 25 W/m K, at least 30 W/m K, at least 35 W/m K, at least 40 W/m K, at least 45 W/m K, at least 50 W/m K, at least 60 W/m K, at least 75 W/m K, at least 100 W/m K, at least 200 W/m K, at least 250 W/m K, at least 300 W/m K, at least 350 W/m K, at least 400 W/m K, at least 450 W/m K, at least 500 W/m K, at least 600 W/m K, at least 750 W/m K, etc.

In some embodiments, the composition may include a plurality of discontinuous fibers, and a solder or other metal in contact with at least some of the discontinuous fibers. The discontinuous fibers may include carbon fibers, and/or other fibers formed using materials such as those described herein. In some cases, the plurality of discontinuous fibers may be substantially aligned which, surprisingly, allows for significantly improved heat transport, e.g., along the direction of alignment or a through-thickness direction. Such compositions may result in improved heat transport, in certain embodiments, due to close packing of the discontinuous fibers. For instance, at least 30 vol % (or other percentages such as described herein) of the fibers may be substantially aligned, which may result in improved heat transport within the composition. In addition, the material may exhibit anisotropic heat conductivity in some embodiments.

In addition, in certain embodiments, the composition may be useful as a shield against electromagnetic interference, instead or in addition to heat transport. In some cases, by increasing the bulk electrical conductivity of the material, for example, using metals such as solder, the material may be able to absorb electromagnetic waves, thereby shielding against electromagnetic interference. The electromagnetic shielding may be partial or total, depending on the application. In some cases, the shielding can reduce the coupling of radio waves, electromagnetic fields, electrostatic fields, or the like, e.g., due to the conductive elements within the composition, e.g., carbon or other fibers such as those described herein. In addition, in some embodiments, increased thermal conductivity of the composition may also correspond to increased electrical conductivity, and/or increased shielding against electromagnetic interference.

Thus, one aspect as discussed herein is generally directed to a plurality of discontinuous fibers. In some embodiments, there may be a relatively high number of discontinuous fibers that are present, e.g., such that they can define a substrate. The discontinuous fibers may form a relatively large percentage of the substrate. For example, at least 20 vol %, at least 30 vol %, at least 40 vol %, at least 50 vol %, at least 60 vol %, at least 70 vol %, at least 80 vol %, at least 90 vol %, at least 95 vol %, at least 97 vol %, or at least 99 vol % of the substrate may be formed from discontinuous fibers.

In addition, in certain embodiments, some or all of the discontinuous fibers may be substantially aligned. Methods for aligning discontinuous fibers are discussed in more detail below. However, it should be understood that the alignment need not be perfect. For example, in some cases such as described herein, at least 5% or more of the fibers within a substrate or composite may exhibit an alignment that is within 45° or less of the average alignment of the plurality of the fibers. Additional embodiments are discussed below.

In addition to discontinuous fibers, there may also be metal such as solder, or other materials, present within the composition, according to certain aspects. In one set of embodiments, such materials may be particularly useful for being able to form good thermal contact between the materials and other components of the device, such as heat sources, heat sinks, cooling apparatuses, etc. In some cases, such materials, when exposed to relatively warm temperatures, may partially or fully soften or liquefy, which may improve thermal contact, e.g., with such components. For instance, in one set of embodiments, the composition may include a metal that begins to soften or liquefy when the device it is in is used (e.g., producing heat). As a non-limiting example, the device may include a semiconductor microchip, e.g., within a computer, and the microchip may be heated during use up to temperatures of between 40° C. and 80° C., between 50° C. and 70° C., etc. Even higher temperatures may be possible in some embodiments. In some cases, the metal or other material may soften or liquefy at such high temperatures, which may improve thermal contact with a semiconductor microchip, e.g., facilitating the transport of heat away from it.

Any of a wide variety of materials may be used. In some cases, the material may change phase due to heat, e.g., from a heat source. For example, the material may at least partially soften or change phase from a solid to a liquid. Without wishing to be bound by any theory, it is believed that a material may be useful in certain cases because it may be able to at least partially flow when heated, e.g., to seal cracks, poor connections, etc., and/or because it absorbs heat energy (e.g., to effect the change of phase) rather than increasing in temperature. In certain embodiments, one or more than one material, such as a metal, may be present.

The plurality of discontinuous fibers may be partially or fully in contact with the material. For instance, in one embodiment, the plurality of discontinuous fibers may be completely embedded within the material. In another embodiment, the plurality of discontinuous fibers may contact the material at their first ends but not their second ends. For instance, the second ends may be in contact with a different material, or may be free in some embodiments. In some cases, at least some of the material may be interspersed with the plurality of discontinuous fibers, and/or may surround some or all of the plurality of discontinuous fibers. For instance, in one embodiment, the material may cover at least a first side of a substrate defined by the discontinuous fibers.

The material may include, for example, a metal such as a solder, or other metals or materials described herein.

In one set of embodiments, the metal has a melting temperature of no more than 265° C. In some cases, the metal may have a melting temperature of no more than 300° C., no more than 290° C., no more than 280° C., no more than 270° C., no more than 260° C., no more than 250° C., no more than 240° C., no more than 230° C., no more than 220° C., no more than 210° C., no more than 200° C., no more than 190° C., no more than 180° C., no more than 170° C., no more than 160° C., no more than 150° C., no more than 140° C., no more than 130° C., no more than 120° C., no more than 110° C., no more than 100° C., etc. In addition, in certain embodiments, the metal may have a melting temperature of at least 50° C., at least 60° C., at least 70° C., at least 80° C., at least 90° C., at least 100° C., at least 110° C., at least 120° C., at least 130° C., at least 140° C., at least 150° C., at least 160° C., at least 170° C., at least 180° C., at least 190° C., at least 200° C., at least 210° C., at least 220° C., at least 230° C., at least 240° C., at least 250° C., at least 260° C., at least 270° C., at least 280° C., at least 290° C., etc. Combinations of any of these are also possible, e.g., the metal may have a melting temperature of between 200° C. and 265° C., between 220° C. and 265° C., between 180° C. and 190° C., between 150° C. and 170° C., etc.

In some embodiments, the metal may be selected to be able to react with carbon, e.g., to form carbides or other intermetallic compounds. For instance, the metal may react with discontinuous fibers that are carbon fibers to form a carbide, e.g., when processed as described herein. Without wishing to be bound by any theory, it is believed that the presence of carbides may facilitate interactions between the metal and the discontinuous fibers. For instance, such carbides may facilitate the ability of the metal to “wet out” the fibers, e.g., facilitating the metal to cover or surround the fibers. In some cases, this may result in compositions having relatively small void volumes, e.g., as discussed herein.

The metal may include indium in one embodiment. Indium has a melting point of about 157° C., and can be alloyed with other metals in certain cases, e.g., as in a solder. The indium may be present at any suitable concentration. For instance, at least 25%, at least 30%, at least 35%, at least 40%, at least 45%, at least 50%, at least 55%, at least 60%, at least 65%, at least 70%, at least 75%, at least 80%, at least 85%, at least 90%, or at least 95% of the metal (by mass) may be indium. However, in some embodiments, no more than 95%, no more than 90%, no more than 85%, no more than 80%, no more than 75%, no more than 70%, no more than 65%, no more than 60%, no more than 55%, no more than 50%, no more than 45%, no more than 40%, no more than 35%, or no more than 30% of the metal may be indium. Combinations of any of these ranges are also possible in other embodiments.

However, other metals may also be present, e.g., in addition to or instead of indium. Non-limiting examples include nickel, chromium, cobalt, tin, or the like. In some cases, the metal may include a transition metal, e.g., including any of the transition metals described herein. For example, the metal may be present within a transition metal rich solder alloy, an oxide coated liquid metal, an oxide coated liquid metal transition metal rich solder alloy, a thermal chemical vapor deposited metal, or a conductive medium such as a conductive ink, etc. The conductive ink may include, for example, silver, copper, carbon, graphene, or the like. One or more than one metal may be present, e.g., forming a metal alloy. Non-limiting examples include solders such as those described herein. Other non-limiting examples of metals include indium with 1%-5% Ag and 0.1%-2% Ni; indium with 1%-5% Ag, 0.1%-2% Cu, and 0.1%-2% Ni, etc. (All percentages are percentage by weight.) In addition, in some cases, as previously mentioned, a metal may diffuse, be vapor deposited or react with carbon, e.g., in a carbon fiber, to form carbides such as indium carbide, nickel carbide, chromium carbide, cobalt carbide, tin carbide, or various transition metal carbides. In addition, in some cases, more than one such carbide may be present or none at all.

In one aspect, metals such as those discussed herein may include solder. The solder may be a metal or metal alloy. As discussed, the solder may be partially or fully in contact with the plurality of discontinuous fibers. For instance, the plurality of discontinuous fibers may be completely or partially embedded within solder and/or solder may be interspersed with the plurality of discontinuous fibers. In some cases, the solder may be able to physically and/or chemically bind to the plurality of discontinuous fibers. For instance, in some embodiments, the solder may react with carbon to form a carbide, which may facilitate binding. In addition, in some cases, solder flux or another organic material may be used to improve binding, e.g., by removing or interacting with oxides (e.g., metal oxides) that may be present and/or with the carbon fiber itself.

In one set of embodiments, the solder may be a low melting point solder. For instance, the solder may have a melting temperature of at least 100° C., at least 110° C., at least 120° C., at least 130° C., at least 140° C., at least 150° C., at least 160° C., at least 170° C., at least 180° C., at least 190° C., at least 200° C., at least 210° C., at least 220° C., at least 230° C., at least 240° C., at least 250° C., at least 260° C., at least 270° C., at least 280° C., at least 290° C., etc., and/or no more than 300° C., no more than 290° C., no more than 280° C., no more than 270° C., no more than 260° C., no more than 250° C., no more than 240° C., no more than 230° C., no more than 220° C., no more than 210° C., no more than 200° C., no more than 190° C., no more than 180° C., no more than 170° C., no more than 160° C., no more than 150° C., no more than 140° C., no more than 130° C., no more than 120° C., no more than 110° C., no more than 100° C., or other melting temperatures such as those described herein. Various low melting point solders can be obtained commercially.

Examples of metals that may be present in solder include indium, tin, bismuth, lead, antimony, or the like. In some cases, more than one such metal may be present. For instance, the solder may be an indium-tin alloy, a tin-bismuth alloy, and/or may include other metals as well, including any of those described herein. Non-limiting examples include SnAgCu solders (for example 96.5% Sn/3.0% Ag/0.5% Cu), InAg solders, InSn solders, InCr solders, or the like. In one set of embodiments, the solder may include a low-melting point metal.

In addition, in certain embodiments, the solder may include a transition metal, e.g., such as a transition metal rich solder alloy. In some cases, at least 0.1%, at least 0.2%, at least 0.5%, at least 1%, at least 5%, at least 10%, at least 15%, at least 20%, at least 30%, at least 50%, at least 60%, at least 70%, at least 80%, or at least 90% of the solder (by weight) may comprise one or more transition metals. Non-limiting examples of suitable transition metals include nickel, chromium, or cobalt. Other examples of transition metals include, but are not limited to, cadmium, zinc, copper, silver, or the like.

In certain cases, the discontinuous fibers may include carbon fibers. In some cases, the carbon may be capable of wetting the solder, diffusing with solder, thermal chemical vapor deposited with solder, or to react with such transition metals to produce a carbide. Non-limiting examples of carbides include indium carbide, nickel carbide, chromium carbide, cobalt carbide, tin carbide, or the like. Without wishing to be bound by any theory, it is believed that the carbide may facilitate the ability of the solder to "wet out" the fibers, e.g., allowing the solder to be interspersed between the fibers, and/or surround at least some of the fibers.

In addition, in some cases, the transition metal rich solder alloy may comprise an oxide coated liquid metal, or an oxide coated liquid metal transition metal rich solder alloy. These may include, in certain embodiments, a liquid metal core surrounded by an oxide shell. The liquid metal, in some cases, may include a solder, for example, SAC305 (96.5% tin, 3% silver, and 0.5% copper), or other solders such as any of those described herein. The oxide may be formed out of oxides such as tin oxide, indium oxide, or the like. Such compositions may be obtained commercially, e.g., from SAFI-Tech Corporation.

In certain embodiments, the metal may be contained within a conductive medium, such as a conductive ink. In some cases, the conductive medium may comprise a dispersion of conductive particles in a flowable medium, such as a polymer, a gel, a solvent or the like. The particles may include, for instance, particles comprising or consisting essentially of a metal (e.g., silver, copper, gold, etc.), carbon particles, carbon nanotubes, graphene particles, or the like. In some cases, more than one type of particle may be present within the medium. The particles may also be conductive in some instances, e.g., having a conductivity of at least $5\times10^3$ S/cm, at least $1\times10^4$ S/cm, at least $3\times10^4$ S/cm, at least $5\times10^4$ S/cm, at least $1\times10^5$ S/cm, at least $3\times10^5$ S/cm, or at least $5\times10^5$ S/cm, etc. In some cases, the particles may have an average dimension of less than 10 micrometers, less than 5 micrometers, less than 1 micrometer, less than 1000 nm, less than 500 nm, less than 300 nm, less than 100 nm, less than 50 nm, etc. The particles may also be of the same or different sizes, and/or the particles may be spherical or non-spherical (e.g., flakes or other shapes). Examples of media that may be present include, but are not limited to alcohols (for example, methanol, ethanol, isopropanol, butanol), glycols (for example, ethylene glycol, glycerin, glycol ether, etc.), acetates (for example, ethyl acetate, butyl acetate, carbitol acetate, etc.), ethers (for example diethyl ether, tetrahydrofuran, dioxane, etc.), ketones (for example, methyl ethyl ketone, acetone, etc.), hydrocarbons (for example, pentane, hexane, heptane, etc.), aromatic (for example, xylene, benzene, toluene, etc.), halogenated solvents (for example, chloroform, methylene chloride, carbon tetrachloride, etc.), or the like. In some cases, the solvent may evaporate after use, e.g., after introduction into the composition. In addition, in some cases, a binder may be present. Examples of binders include, but are not limited to, acrylics (e.g., polyacrylic acid, polyacrylic acid ester, etc.), cellulose (e.g., ethyl cellulose, cellulose ester, cellulose nitrate, etc.), an aliphatic or copolymer polyester, a vinyl (e.g., polyvinylbutyral, polyvinylacetate, polyvinylpyrrolidone, etc.), a polyamide, a polyurethane, a polyether, a urea, an alkyd, a silicone, a fluorine, an olefin (e.g., polyethylene, polystyrene, etc.), a thermoplastic (e.g., petroleum, rosin, etc.), an epoxy, a phenol, a silicone (e.g., silicone epoxy, silicone polyester, etc.), a thermoset (e.g., melamine), or the like. Conductive media, such as conductive ink, may be obtained commercially.

In certain aspects, the composition may include solder flux. The solder flux may include a chemical cleaning agent, flowing agent, and/or purifying agent. In some cases, the solder flux may include acids (e.g., organic acids). Without wishing to be bound by any theory, it is believed that in some embodiments, the solder flux may react with oxides, e.g., within the solder and/or within the discontinuous fibers, and in some embodiments, remove or neutralize such oxides, e.g., to facilitate contact between the solder and the discontinues fibers. Non-limiting examples of solder flux include rosin, sodium carbonate, potash, charcoal, coke, borax, lime, lead sulfide, or the like. Additional non-limiting examples include acids, such as citric acid, lactic acid, stearic acid, hydrochloric acid, zinc chloride, and ammonium chloride, or the like. In some cases, solvents such as isopropyl alcohol or water can be present.

Other materials may be present as well in accordance with certain aspects, e.g., instead of and/or in addition to a metal such a solder. For instance, in one embodiment, the material can include a phase change material. Non-limiting examples of phase change materials include silicones, acrylics, thermoplastics, or the like. Additional examples include trimethylolethane, lithium nitrate, manganese nitrate, manganese chloride, etc. See also U.S. Pat. Apl. Ser. No. 63/314,808, entitled "Thermally Conductive Aligned Materials and Methods of Making and Use Thereof," incorporated herein by reference in its entirety.

As another example, in one set of embodiments, the phase change material may comprise a wax. The wax may include alkanes and/or lipids, and may be naturally occurring or artificially produced. In some cases, the waxes are substantially water insoluble. In some cases, the wax may have a melting temperature of at least 40° C., or other phase change temperatures such as any of those described herein. Non-limiting examples of waxes include paraffin wax, polyethylene wax, hydrocarbon wax, beeswax, cetyl palmitate, plant waxes, montan wax, lauric acid, or the like.

As yet another example, the phase change material may comprise a salt hydrate. Non-limiting examples of salt hydrates include potassium fluoride tetrahydrate, manganese nitrate hexahydrate, calcium chloride hexahydrate, calcium bromide hexahydrate, lithium nitrate hexahydrate, sodium sulfate decahydrate, sodium carbonate decahydrate, sodium orthophosphate dodecahydrate, zinc nitrate hexahydrate, sodium sulfate decahydrate, etc. For example, in one embodiment, the salt hydrate may have a formula $NaCl\cdot Na_2SO_4\cdot 10H_2O$.

As still another example, the phase change material may comprise a eutectic. Typically, a eutectic is a mixture of two or more substances that has a lower melting point than any of the substances forming the eutectic. For example, the eutectic may have a melting temperature of between 0° C. and 80° C., or other phase change temperatures such as any of those described herein. As non-limiting examples, the eutectic may be an organic-organic eutectic or an organic-inorganic eutectic. Specific non-limiting examples include myristic acid and stearic acid, $Mg(NO_3)_2\cdot 6H_2O$ and glutaric acid, ethylene glycol distearate, or the like.

Accordingly, as discussed, in accordance with certain aspects, a metal such as solder may be in contact with a plurality of discontinuous fibers. The metal may be interspersed or infiltrated between the plurality of discontinuous fibers, and/or surround at least some of the fibers, or all of the discontinuous fibers in some embodiments. In some cases, carbides, solder fluxes, and/or other materials may be present to facilitate contact or "wetting out" of the metal to the fibers. However, it should be understood that in certain cases, such contact may not be perfect, and there may be some void volumes present, e.g., where the fibers are not in contact with the metal.

For instance, in certain embodiments, on average, at least 30% of the lengths of the discontinuous fibers may be in contact with a metal, such as a solder. In addition, in some cases, at least 40%, at least 50%, at least 60%, at least 70%, at least 80%, or at least 90% of the lengths of the discontinuous fibers may be in contact with a metal, such as a solder. In certain cases, no more than 90%, no more than 80%, no more than 70%, no more than 60%, no more than 50%, no more than 40%, etc. of the lengths of the discontinuous fibers may be in contact with a metal, such as a solder. Combinations of these ranges are also possible in accordance with certain embodiments.

In some cases, the combination of metal and discontinuous fibers may define void volumes within the composition that are not exposed to the external environment surrounding the composition, e.g., such that the void volumes are fully enclosed. For instance, the void volumes may represent gas or air pockets trapped within the composition. In certain embodiments, for example, the plurality of discontinuous fibers and the metal together have an internal void volume of no more than 50%, no more than 40%, no more than 30%, no more than 20%, no more than 10%, or no more than 5% of the composition. In some cases, surprisingly low void volumes may be achieved, e.g., due to the ability of the metal or solder to flow along the fibers and fill in spaces during formation of composition.

In addition, in certain embodiments, the plurality of discontinuous fibers may be more thermally conductive than the metal. Thus, the composition may still exhibit heat transfer despite the presence of any void volumes, since heat may be transferred via the plurality of discontinuous fibers through such void volumes.

As mentioned, the composition may include a plurality of discontinuous fibers in various aspects. In some cases, the discontinuous fibers may be substantially aligned, e.g., defining a substrate. In some embodiments, at least 20 vol %, at least 30 vol %, at least 40 vol %, at least 50 vol %, at least 60 vol %, at least 70 vol %, at least 80 vol %, at least 90 vol %, at least 95 vol %, at least 97 vol %, at least 99 vol %, etc. of the substrate may contain discontinuous fibers. In addition, at least 20 vol %, at least 30 vol %, at least 40 vol %, at least 50 vol %, at least 60 vol %, at least 70 vol %, at least 80 vol %, at least 90 vol %, at least 95 vol %, at least 97 vol %, or at least 99 vol % of the substrate may be formed from discontinuous fibers.

The discontinuous fibers may be formed or include any of a wide variety of materials, and one or more than one type of material may be present. For example, the discontinuous fibers may comprise materials such as carbon (e.g., carbon fibers), basalt, silicon carbide, silicon nitride, aramid, zirconia, nylon, boron, alumina, silica, borosilicate, mullite, nitride, boron nitride, graphite, glass, a polymer (including any of those described herein), or the like. The discontinuous fibers may include any natural and/or any synthetic material, and may be magnetic and/or non-magnetic.

In addition, in some cases, the discontinuous fibers may be formed from materials having relatively high thermal conductivity. For instance, in various embodiments, the discontinuous fibers may have thermal conductivities of at least 5 W/m K, at least 10 W/m K, at least 100 W/m K, at least 200 W/m K, at least 250 W/m K, at least 300 W/m K, at least 350 W/m K, at least 400 W/m K, at least 450 W/m K, at least 500 W/m K, at least 600 W/m K, at least 750 W/m K, at least 900 W/m K, etc. In some cases, the discontinuous fibers may be more thermally conductive than the metal.

The discontinuous fibers, in some embodiments, may be at least substantially aligned. Methods for aligning discontinuous fibers are discussed in more detail herein. Various alignments are possible, and in some cases, can be determined optically or microscopically, e.g. Thus, in some cases, the alignment may be determined qualitatively. However, it should be understood that the alignment need not be perfect. In some cases, at least 5%, at least 10%, at least 25%, at least 30%, at least 35%, at least 40%, at least 45%, at least 50%, at least 55%, at least 60%, at least 65%, at least 70%, at least 75%, at least 80%, at least 85%, at least 90%, or at least 95% of the fibers (e.g., by volume or by number) within a substrate may be substantially aligned, or may exhibit an alignment that is within 45°, within 40°, within 35°, within 30°, within 25°, within 20°, within 15°, within 10°, or within 5° of the average alignment of the plurality of the fibers, e.g., within a sample of the substrate.

In addition, in some cases, the average alignment of the fibers may be oriented to be at at least 45°, least 60°, at least 65°, at least 70°, at least 75°, at least 85°, or at least 87° relative to the plane of the substrate at that location. Without wishing to be bound by any theory, it is believed that alignment of the discontinuous fibers substantially orthogonal to the substrate within the composition may serve to provide structural reinforcement of the substrate and/or the ability to transfer heat preferentially in a direction along the direction of the discontinuous fibers, e.g., such that the composition may exhibit anisotropic heat conductivity. For instance, the composition may exhibit a heat conductivity in one direction of at least 3 W/m K, at least 5 W/m K, at least 10 W/m K, at least 30 W/m K, at least 50 W/m K, at least 100 W/m K, 250 W/m K, at least 500 W/m K, at least 750 W/m K, etc. For instance, this may be in a direction defined by the average alignment of the discontinuous fibers, or a through-thickness direction of a substrate, e.g., substantially perpendicular to the plane of the substrate. In some embodiments, this may allow improved heat transfer, e.g., away from a heat source.

While others have suggested packing fibers in a substrate, it is believed that higher fiber volume fractions were previously unachievable, e.g., in thermal interface materials. Without wishing to be bound by any theory, it is believed that this may be due to higher electrostatic interactions that cause fiber agglomeration, and/or higher viscosities of polymer resins that can prevent consistent dispersion. Accordingly, certain embodiments as discussed herein are generally directed to fiber volume fractions (e.g., of substantially aligned fibers such as those discussed herein) of at least 40% fiber volume, at least 45% fiber volume, at least 50% fiber volume, at least 55% fiber volume, at least 60% fiber volume, at least 65% fiber volume, at least 70% fiber volume, etc.

A variety of techniques may be used to align the discontinuous fibers in various embodiments, including magnetic fields, shear flow, or the like, as are discussed in more detail herein. As a non-limiting example, magnetic particles, including those discussed herein, can be attached to the fibers, and a magnetic field may then be used to manipulate the magnetic particles. For instance, the magnetic field may be used to move the magnetic particles into a substrate, and/or to align the discontinuous fibers. The magnetic field may be constant or time-varying (e.g., oscillating), for instance, as is discussed herein. For example, an applied magnetic field may have a frequency of 1 Hz to 500 Hz and an amplitude of 0.01 T to 10 T. Other examples of magnetic fields are described in more detail below.

In some cases, the discontinuous fibers may have an average length, or characteristic dimension, of at least 1 nm, at least 3 nm, at least 5 nm, at least 10 nm, at least 30 nm, at least 50 nm, at least 100 nm, at least 300 nm, at least 500 nm, at least 1 micrometer, at least 3 micrometers, at least 5 micrometers, at least 10 micrometers, at least 20 micrometers, at least 30 micrometers, at least 50 micrometers, at least 100 micrometers, at least 200 micrometers, at least 300 micrometers, at least 500 micrometers, at least 1 mm, at least 2 mm, at least 3 mm, at least 5 mm, at least 10 mm, at least 15 mm, etc. In certain embodiments, the discontinuous fibers may have an average length, or characteristic dimension, of no more than 5 cm, no more than 3 cm, no more than 2 cm, no more than 1.5 cm, no more than 1 cm, no more than 5 mm, no more than 3 mm, no more than 2 mm, no more than 1 mm, no more than 500 micrometers, no more than 300 micrometers, no more than 200 micrometers, no more than 100 micrometers, no more than 50 micrometers, no more than 30 micrometers, no more than 20 micrometers, no more than 10 micrometers, no more than 5 micrometers, no more than 3 micrometers, no more than 1 micrometers, no more than 500 nm, no more than 300 nm, no more than 100 nm, no more than 50 nm, no more than 30 nm, no more than 10 nm, no more than 5 nm, etc. Combinations of any of these are also possible. For example, the plurality of discontinuous fibers may have an average length of between 1 mm and 5 mm.

In addition, the discontinuous fibers may also have any suitable average diameter. For instance, the discontinuous fibers may have an average diameter of at least 5 micrometers, at least 10 micrometers, at least 20 micrometers, at least 30 micrometers, at least 50 micrometers, at least 100 micrometers, at least 200 micrometers, at least 300 micrometers, at least 500 micrometers, at least 1 mm, at least 2 mm, at least 3 mm, at least 5 mm, at least 1 cm, at least 2 cm, at least 3 cm, at least 5 cm, at least 10 cm, etc. In certain embodiments, the discontinuous fibers may have an average diameter of no more than 10 cm, no more than 5 cm, no more than 3 cm, no more than 2 cm, no more than 1 cm, no more than 5 mm, no more than 3 mm, no more than 2 mm, no more than 1 mm, no more than 500 micrometers, no more than 300 micrometers, no more than 200 micrometers, no more than 100 micrometers, no more than 50 micrometers, no more than 30 micrometers, no more than 20 micrometers, no more than 10 micrometers, no more than 5 micrometers, etc. Combinations of any of these are also possible. For example, the discontinuous fibers may have an average diameter of between 5 micrometers and 50 micrometers, 10 micrometers and 100 micrometers, between 50 micrometers and 500 micrometers, between 100 micrometers and 5 mm, etc.

In certain embodiments, the discontinuous fibers may have a length that is at least 10 times or at least 50 times its thickness or diameter, on average. In some cases, the fibers may have an average aspect ratio (ratio of fiber length to diameter or thickness) of at least 3, at least 5, at least 10, at least 30, at least 50, at least 100, at least 300, at least 500, at least 1,000, at least 3,000, at least 5,000, at least 10,000, at least 30,000, at least 50,000, or at least 100,000. In some cases, the average aspect ratio may be less than 100,000, less than 50,000, less than 30,000, less than 10,000, less than 5,000, less than 3,000, less than 1,000, less than 500, less than 300, less than 100, less than 50, less than 30, less than 10, less than 5, etc. Combinations of any of these are also possible in some cases; for instance, the aspect ratio may be between 5, and 100,000.

At least some of the discontinuous fibers may be uncoated. In some cases, however, some or all of the discontinuous fibers may be coated. The coating may be used, for example, to facilitate the adsorption or binding of particles, such as magnetic particles, onto the fibers, or for other reasons. As one non-limiting example, at least some of the discontinuous fibers are coated with sizing. Some examples of coatings or sizings include, but are not limited to, polypropylene, polyurethane, polyamide, phenoxy, polyimide, epoxy, or the like. These can be introduced, for example, as a solution, dispersion, emulsion, etc. As other examples, the fibers may be coated with a surfactant, a silane coupling agent, an epoxy, glycerine, polyurethane, an organometallic coupling agent, or the like. Non-limiting examples of surfactants include oleic acid, sodium dodecyl sulfate, sodium lauryl sulfate, etc. Non-limiting examples of silane coupling agents include amino-, benzylamino-, chloropropyl-, disulfide-, epoxy-, epoxy/melamine-, mercapto-, methacrylate-, tertasulfido-, ureido-, vinyl-, isocynate-, and vinly-benzyl-amino-based silane coupling agents. Non-limiting examples of organometallic coupling agents include aryl- and vinyl-based organometallic coupling agents.

As mentioned, in one set of embodiments, at least some of the discontinuous fibers may be carbon fibers. The carbon fibers may be aligned in a magnetic field directly or indirectly, e.g., using magnetic particles or other techniques such as those discussed herein. For instance, some types of carbon fibers are diamagnetic, and can be directly moved using an applied magnetic field. Thus, certain embodiments are directed to fibers that are substantially free of paramagnetic or ferromagnetic materials could still be aligned using an external magnetic field. For example, if any paramagnetic or ferromagnetic materials are present, they may form less than 5%, less than 1%, less than 0.5%, less than 0.3%, less than 0.1%, less than 0.05%, less than 0.03%, less than 0.01%, less than 0.005%, less than 0.003%, or less than 0.001% (by mass) of the material.

A variety of carbon fibers may be obtained commercially, including diamagnetic carbon fibers. In some cases, carbon fibers can be produced from polymer precursors such as polyacrylonitrile (PAN), rayon, pitch, or the like. In some cases, carbon fibers can be spun into filament yarns, e.g., using chemical or mechanical processes to initially align the polymer atoms in a way to enhance the final physical properties of the completed carbon fibers. Precursor compositions and mechanical processes used during spinning filament yarns may vary. After drawing or spinning, the polymer filament yarns can be heated to drive off non-carbon atoms (carbonization or pyrolization), to produce final carbon fiber. In some embodiments, such techniques may be used to produce carbon fiber with relatively high carbon content, e.g., at least 90%, or other contents as described herein.

Non-limiting examples of carbon fibers include, for instance, pitch- and/or polymer-based (e.g. ex-PAN or ex-Rayon) variants, including those commercially-available. In some cases, these may include intermediate/standard modulus (greater than 200 GPa) carbon fibers, high modulus (greater than 300 GPa), or ultra-high modulus (greater than 500 GPa) carbon fibers.

In one set of embodiments, the carbon fibers have a relatively high carbon content. Without wishing to be bound by any theory, it is believed that such fibers may exhibit diamagnetic properties that allows them to be oriented with low-energy magnetic fields. In general, diamagnetism is the repulsion of a material to an applied magnetic field by generation of an induced magnetic field that is opposite in direction to the applied magnetic field. A material is typically categorized as diamagnetic if it lacks noticeable paramagnetic or ferromagnet contributions to the overall magnetic response. In many cases, the magnetic response of diamagnetic materials is very weak and negligible. However, relatively high magnetic fields can induce a noticeable physical response in such diamagnetic materials.

Thus, in some cases, carbon fibers exhibiting relatively highly-oriented molecular structures may exhibit anisotropic, high-diamagnetism diamagnetic properties. Such diamagnetic properties may allow them to be oriented with relatively weak magnetic fields, such as is described herein. For example, in one set of embodiments, an applied magnetic field may generate a strong induced magnetic field in the C—C bonds of a carbon fiber in the opposite direction of the applied magnetic field. Certain types of carbon fibers may possess a high degree of C—C bonds parallel to the in-fiber direction, which may create an anisotropic diamagnetic response. Thus, such carbon fibers can be subjected to a magnetic torque that is neutralized when the carbon fiber aligns fully-parallel to the applied magnetic field. Accordingly, by applying a suitable magnetic field, the carbon fibers may be aligned due to such diamagnetic properties. This response may be sufficient to overcome gravitational, viscous, and/or interparticle steric effects.

For instance, in certain embodiments, the carbon fibers may have a carbon content of greater than 80%, greater than 90%, greater than 92%, greater than 94%, greater than 95%, greater than 96%, greater than 97%, greater than 98% greater than 99%, or greater than 99.5% by mass. Such carbon fibers may be obtained commercially in some cases. For example, the carbon fibers may be produced pyrolytically e.g., by "burning" or oxidizing other components that can be removed (e.g., by turning into a gas), leaving behind a carbon fiber with a relatively high carbon content. Other methods of making carbon fibers are also possible, e.g., as discussed in detail herein.

The carbon fibers may also exhibit substantial alignment of the C—C bonds within the carbon fibers in some instances. For instance, at least 50%, at least 60%, at least 70%, at least 75%, at least 80%, at least 85%, at least 90%, or at least 95% of the carbon fibers may exhibit substantial alignment of the C—C bonds. Such alignment may be determined, for example, using wide angle x-ray diffraction (WAXD), or other techniques known to those of ordinary skill in the art.

In one set of embodiments, the carbon fibers (or other discontinuous fibers) may have a relatively high modulus (tensile modulus, which is a measure of stiffness). Typically, higher modulus fibers are stiffer and lighter than low modulus fibers. Carbon fibers typically have a higher modulus when force is applied parallel to the fibers, i.e., the carbon fibers are anisotropic. In some embodiments, the carbon fibers (or other discontinuous fibers) may have a modulus (e.g., when force is applied parallel to the fibers) of at least 100 GPa, at least 200 GPa, at least 300 GPa, at least 400 GPa, at least 500 GPa, at least 600 GPa, at least 700 GPa, etc. It is believed that more flexible carbon fibers may exhibit less alignment, i.e., carbon fibers having a low modulus may have subtle physical responses to magnetic fields, or have no response, rather than align within an applied magnetic field.

In one set of embodiments, the carbon fibers (or other discontinuous fibers) may exhibit an anisotropic diamagnetic response when free-floating within a liquid (e.g., water, oil, polymer resin, polymer melt, metal melt, an alcohol such as ethanol, or another volatile organic compound), and a magnetic field is applied. For example, in some cases, the carbon fibers may align when a suitable magnetic field is applied, i.e., indicative of a diamagnetic response. In some cases, the magnetic field may be at least 100 mT, at least 200 mT, at least 300 mT, at least 500 mT, at least 750 mT, at least 1 T, at least 1.5 T, at least 2 T, at least 3 T, at least 4 T, at least T, at least 10 T, etc. In some cases, at least 30%, at least 40%, at least 50%, at least 60%, at least 70%, at least 80%, or at least 90%, of the free-floating carbon fibers within the liquid may exhibit alignment when a suitable magnetic field is applied.

Typically, a fiber has a shape such that one orthogonal dimension (e.g., its length) is substantially greater than its other two orthogonal dimensions (e.g., its width or thickness). The fiber may be substantially cylindrical in some cases. As mentioned, the carbon fibers may be relatively stiff, in some instances; however, a carbon fiber need not be perfectly straight (e.g., its length may still be determined along the fiber itself, even if it is curved).

As mentioned, in one set of embodiments, particles such as magnetic particles may be added, for example, to align the discontinuous fibers, or for other applications. The particles may be adsorbed or otherwise bound to at least some of the discontinuous fibers. In some cases, the particles may coat some or all of the discontinuous fibers and/or the continuous fibers. This may be facilitated by a coating of material as discussed herein, although a coating is not necessarily required to facilitate the adsorption of the particles.

If the particles are magnetic, the particles may comprise any of a wide variety of magnetically susceptible materials. For example, the magnetic materials may comprise one or more ferromagnetic materials, e.g., containing iron, nickel, cobalt, alnico, oxides of iron, nickel, cobalt, rare earth metals, or an alloy including two or more of these and/or other suitable ferromagnetic materials. In some cases, the magnetic particles may have a relative permeability of at least 2, at least 5, at least 10, at least 20, at least 40, at least 100, at least 200, at least 500, at least 1,000, at least 2,000, at least 5,000, or at least 10,000.

However, it should be understood that not all of the particles are necessarily magnetic. In some cases, non-magnetic particles may be used, e.g., in addition to and/or instead of magnetic particles. Non-limiting examples of nonmagnetic particles include glass, polymer, metal, or the like. In addition, in some embodiments, no particles are present.

The particles (if present) may be spherical or non-spherical, and may be of any suitable shape or size. The particles may be relatively monodisperse or come in a range of sizes. In some cases, the particles may have a characteristic dimension, on average, of at least 10 micrometers, at least 20 micrometers, at least 30 micrometers, at least 50 micrometers, at least 100 micrometers, at least 200 micrometers, at least 300 micrometers, at least 500 micrometers, at least 1 mm, at least 2 mm, at least 3 mm, at least 5 mm, at least 1 cm, at least 1.5 cm, at least 2 cm, at least 3 cm, at least 5 cm, at least 10 cm, etc. The particles may also have an average characteristic dimension of no more than 10 cm, no more than 5 cm, no more than 3 cm, no more than 2 cm, no more than 1.5 cm, no more than 1 cm, no more than 5 mm, no more than 3 mm, no more than 2 mm, no more than 1 mm, no more than 500 micrometers, no more than 300 micrometers, no more than 200 micrometers, no more than 100 micrometers, no more than 50 micrometers, no more than 30 micrometers, no more than 20 micrometers, no more than 10 micrometers, etc. Combinations of any of these are also possible. For example, the particles may exhibit a characteristic dimension of or between 100 micrometer and 1 mm, between 10 micrometer and 10 micrometer, etc. The characteristic dimension of a nonspherical particle may be taken as the diameter of a perfect sphere having the same volume as the nonspherical particle.

In addition, in some aspects, the substrate may further comprise fillers or additional materials, e.g., in addition to discontinuous fibers. For example, in one example set of embodiments, the substrate comprises a plurality of continuous fibers. The continuous fibers may have a length that, on average, is substantially longer than the cross-sectional dimension of the discontinuous fibers. For example, the continuous fibers may have an average length of at least about 0.5 cm, at least 1 cm, at least 2 cm, at least 3 cm, at least 5 cm, at least 10 cm, etc. In certain embodiments, the continuous fibers may have an average diameter of no more than 10 cm, no more than 5 cm, no more than 3 cm, no more than 2 cm, no more than 1 cm, no more than 0.5 cm, or the like. Combinations of any of these are also possible; for example, the continuous fibers may have an average length of between 1 cm and 10 cm, between 10 cm and 100 cm, etc. Longer average lengths are also possible in some instances.

The continuous fibers may be woven together (e.g. bidirectional, multidirectional, quasi-isotropic, etc.), and/or nonwoven (e.g., unidirectional, veil, mat, etc.). In certain embodiments, at least some of the continuous fibers are substantially parallel, and/or orthogonally oriented relative to each other, although other configurations of continuous fibers are also possible. In certain embodiments, the continuous fibers may together define a fabric or other substrate, e.g., a textile, a tow, a filament, a yarn, a strand, or the like. In some cases, the substrate may have one orthogonal dimension that is substantially less than the other orthogonal dimensions (i.e., the substrate may have a thickness). The continuous fibers may also comprise any of a wide variety of materials, and one type or more than one type of fiber may be present within the substrate. Non-limiting examples include carbon, basalt, silicon carbide, aramid, zirconia, nylon, boron, alumina, silica, borosilicate, mullite, cotton, or any other natural or synthetic fibers.

In some instances, the continuous fibers may comprise a relatively large portion of the composite. For example, in certain embodiments, the continuous fibers may comprise at least 1%, at least 2%, at least 3%, at least 4%, at least 5%, at least 7%, at least 10%, at least 15%, at least 20%, at least 25%, at least 30%, at least 35%, at least 40%, at least 45%, at least 50%, at least 55%, at least 60%, at least 65%, at least 70%, at least 75%, at least 80%, at least 85%, at least 90%, at least 95%, or at least 97% of the mass or volume of the composite. In some cases, the continuous fibers comprise no more than 97%, no more than 95%, no more than 90%, no more than 85%, no more than 80%, no more than 70%, no more than 60%, no more than 50%, no more than 40%, no more than 30%, no more than 20%, or no more than 10% of the mass or volume of the composite. Combinations of any of these are also possible.

In some cases, one or more fillers may be present in the substrate. For instance, in certain embodiments, the substrate may further comprise one or more ceramics, such as boron nitride, alumina, titania, or the like. In addition, in some embodiments, the substrate may further comprise one or more metals, such as aluminum, copper, silver, tin, gold, etc. In addition, in one embodiment, such materials present within the substrate may be formed by fusing particles together, e.g., during formation of the substrate. Other materials may also be present in the substrate in some cases as well.

As discussed, certain aspects are generally directed to compositions, for example, comprising a plurality of discontinuous fibers and a metal such as solder, or other materials such as those described herein. In some cases, the composition is generally planar, and/or may contain one (or more) substrates. However, it should be understood that the substrate or the composition need not be a mathematically-perfect planar structure (although it can be); for instance, a substrate, or a composition may also be deformable, curved, bent, folded, rolled, creased, or the like. As examples, the substrate, may have an average thickness of at least about 0.1 micrometers, at least about 0.2 micrometers, at least about 0.3 micrometers, at least about 0.5 micrometers, at least about 1 micrometer, at least about 2 micrometers, at least about 3 micrometers, at least about 5 micrometers, at least about 10 micrometers, at least about 30 micrometers, at least about 50 micrometers, at least about 100 micrometers, at least about 300 micrometers, at least about 500 micrometers, at least about 1 mm, at least about 2 mm, at least about 3 mm, at least about 5 mm, at least about 1 cm, at least about 3 cm, at least about 5 cm, at least about 10 cm, at least about 30 cm, at least about 50 cm, at least about 100 cm, etc. In certain instances, the average thickness may be less than 100 cm, less than 50 cm, less than 30 cm, less than 10 cm, less than 5 cm, less than 3 cm, less than 1 cm, less than 5 mm, less than 2 mm, less than 3 mm, less than 1 mm, less than 500 micrometers, less than 300 micrometers, less than 100 micrometers, less than 50 micrometers, less than 30 micrometers, less than 10 micrometers, less than 5 micrometers, less than 3 micrometers, less than 1 micrometers, less than 0.5 micrometers, less than 0.3 micrometers, or less than 0.1 micrometers. Combinations of any of these are also possible in certain embodiments. For instance, the average thickness may be between 0.1 and 5,000 microns, between 10 and 2,000 microns, between 50 and 1,000 microns, or the like. The thickness may be uniform or non-uniform across the substrate. Also, the substrate, may be deformable in some cases.

In certain embodiments, the composition may have an areal weight of at least 50 $g/m^2$ of the composition, and in some embodiments, at least 100 $g/m^2$, at least 150 $g/m^2$, at least 200 $g/m^2$, at least 250 $g/m^2$, at least 300 $g/m^2$, at least 400 $g/m^2$, at least 500 $g/m^2$, at least 750 $g/m^2$, at least 1000 $g/m^2$ of the composition. It will be understood by those of ordinary skill in the art that the area is the bulk or overall area of the composition, not the individual area of discontinuous fibers that may be present.

The composition, in some cases, may contain additional layers or materials, e.g., in addition to these. For example, the substrate may be one of a number of layers within the composition. Other layers within the composition may include polymers, composite materials, metal, ceramics, or the like. For example, the composition may be consolidated with another layer to form a composite structure.

Certain aspects are generally directed to systems and methods for making compositions such as those described herein. In one set of embodiments, such compositions can be prepared from a liquid. The liquid may be, for example, a slurry, a solution, an emulsion, or the like. The liquid may contain discontinuous fibers such as discussed herein. The fibers may then be aligned as discussed herein, and the liquid may be then be removed, e.g., to create a fiber-containing substrate. After alignment, the final composition may be formed, for example, by applying heat and/or pressure, e.g., to remove the liquid.

In one set of embodiments, the liquid is able to neutralize the electrostatic interactions between the discontinuous fibers, for example using aqueous liquids. This may be useful, for example, to allow the discontinuous fibers to be dispersed within the liquid at relatively high fiber volumes without agglomeration. In some cases, surfactants and/or alcohols can be introduced into the slurry to reduce electrostatic interactions between the fibers. High shear mixing and flow also may help reduce agglomeration/flocculation in certain cases.

In some embodiments, the liquid phase may include, for example, a thermoplastic or a thermoset, e.g., a thermoplastic solution, thermoplastic melt, thermoset, volatile organic compound, water, or oil. Non-limiting examples of thermosets include phenolics, epoxies, bismaleimides, cyanate esters, polyimides, etc. Non-limiting examples of elastomers include silicone rubber and styrene butadiene rubber, etc. Non-limiting examples of thermoplastics include epoxy, polyester, vinyl ester, polycarbonates, polyamides (e.g., nylon, PA-6, PA-12, etc.), polyphenylene sulfide, polyetherimide, polyetheretherketone, polyetherketoneketone, etc. Non-limiting examples of ceramic monomers include a siloxane, a silazane, or a carbosilane, etc. In some cases, for example, one or more of these may be added to assist in homogenously dispersing the discontinuous fibers within the liquid. Examples of volatile organic compounds include, but are not limited to, isopropanol, butanol, ethanol, acetone, toluene, or xylenes.

Any suitable amount of discontinuous fiber may be present in the slurry or other liquid. For instance, at least 10%, at least 15%, at least 20%, at least 25%, at least 30%, at least 35%, at least 40%, at least 45%, at least 50%, at least 55%, at least 60%, at least 65%, at least 70%, at least 75%, or at least 80% of the volume of the slurry may be discontinuous fiber. In some cases, no more than 85%, no more than 80%, no more than 75%, no more than 70%, no more than 65%, no more than 60%, no more than 55%, no more than 50%, no more than 45%, no more than 40%, no more than 35%, no more than 30%, no more than 25%, no more than 20%, no more than 15%, or no more than 10% may be discontinuous fiber. Combinations of any of these are also possible in some cases. For example, a slurry or other liquid may contain between 70% and 80%, between 75% and 85%, between 50% and 90%, etc. discontinuous fiber.

For example, after preparation of the slurry or other liquid, it may be applied to or exposed to a surface, e.g., to form a substrate. Any suitable method may be used to apply the slurry or other liquid to the surface. As non-limiting examples, the liquid may be poured, coated, sprayed, or painted onto the surface, or the surface may be immersed partially or completely within the liquid. The liquid may be used to wet, coat, and/or surround the surface.

A magnetic field may be applied to manipulate the discontinuous fibers, directly or indirectly, as discussed herein, according to one set of embodiments. Any suitable magnetic field may be applied. In some cases, the magnetic field is a constant magnetic field. In other cases, the magnetic field may be time-varying; for example, the magnetic field may oscillate or periodically change in amplitude and/or direction, e.g., to facilitate manipulation of the discontinuous agents. The oscillation may be sinusoidal or another repeating waveform (e.g., square wave or sawtooth). The frequency may be, for example, at least 0.1 Hz, at least 0.3 Hz, at least 0.5 Hz, at least 1 Hz, at least 3 Hz, at least 5 Hz, at least 10 Hz, at least 30 Hz, at least 50 Hz, at least 100 Hz, at least 300 Hz, at least 500 Hz, etc., and/or no more than 1000 Hz, no more than 500 Hz, no more than 300 Hz, no more than 100 Hz, no more than 50 Hz, no more than 30 Hz, no more than 10 Hz, no more than 5 Hz, no more than 3 Hz, etc. For example, the frequency may be between 1 Hz to 500 Hz, between 10 Hz and 30 Hz, between 50 Hz and Hz, or the like. In addition, the frequency may be held substantially constant, or the frequency may vary in some cases.

The magnetic field, whether constant or oscillating, may have any suitable amplitude. For example, the amplitude may be at least 0.001 T, at least 0.003 T, at least 0.005 T, at least 0.01 T, at least 0.03 T, at least 0.05 T, at least 0.1 T, at least 0.3 T, at least 0.5 T, at least 1 T, at least 3 T, at least 5 T, at least 10 T, etc. The amplitude in some cases may be no more than 20 T, no more than 10 T, no more than 5 T, no more than 3 T, no more than 1 T, no more than 0.5 T, no more than 0.3 T, no more than 0.1 T, no more than 0.05 T, no more than 0.03 T, no more than 0.01 T, no more than 0.005 T, no more than 0.003 T, etc. The amplitude may also fall within any combination of these values. For instance, the amplitude may be between 0.01 T to 10 T, between 1 T and 3 T, between 0.5 T and 1 T, or the like. The amplitude may be substantially constant, or may vary in certain embodiments, e.g., within any range of these values.

In some embodiments, the magnetic field direction (i.e., direction of maximum amplitude) may vary by +/−90°, +/−85°, +/−80°, +/−75°, +/−70°, +/−65°, +/−60°, +/−55°, +/−50°, +/−45°, +/−40°, +/−35°, +/−30°, +/−25°, +/−20°, +/−15°, +/−10°, +/−5° about a mean direction.

A variety of different devices for producing suitable magnetic fields may be obtained commercially, and include permanent magnets or electromagnets. In some cases, an oscillating magnetic may be created by attaching a magnet to a rotating disc and rotating the disc at an appropriate speed or frequency. Non-limiting examples of permanent magnets include iron magnets, alnico magnets, rare earth magnets, or the like.

In one set of embodiments, shear flow may be used to align or manipulate the discontinuous fibers. For example, a shearing fluid may be applied to the substrate to cause at least some of the plurality of discontinuous agents to align, e.g., in the direction of shear flow. Examples of shearing fluids that may be used include water, or another liquid, such as oil, an alcohol such as ethanol, an organic solvent (e.g., such as isopropanol, butanol, ethanol, acetone, toluene, or xylenes), or the like. In certain embodiments, the shearing fluid may have a viscosity of at least 1 cP. In addition, in some cases, the shearing fluid may be a gas, such as air. The linear flow rate of the shearing fluid, may be, for example, at least 10 mm/min, at least 20 mm/min, at least 30 mm/min, at least 50 mm/min, at least 100 mm/min, at least 200 mm/min, at least 300 mm/min, etc.

For example, in one set of embodiments, the fibers can be added to a liquid, including an alcohol, solvent, or resin, to form a slurry. The slurry can be flowed to align the fibers in some cases, e.g., wherein the slurry is used as a shearing fluid. In other cases, however, the slurry may first be applied to a substrate, then a shearing fluid used to align the fibers.

In addition, in some embodiments, mechanical vibration may be used to manipulate the discontinuous fibers, e.g., in addition to and/or instead of magnetic manipulation and/or shear flow. For example, mechanical vibration can be used to move discontinuous fibers into or on the substrate, e.g., into pores or holes within the substrate, and/or at least to substantially align the discontinuous agents within the substrate, e.g., as discussed herein. In one set of embodiments, mechanical vibration may be applied to cause motion of the discontinuous fibers of at least 1 micrometer, at least 2 micrometers, at least 3 micrometers, at least 5 micrometers, at least 10 micrometers, at least 20 micrometers, at least 30 micrometers, at least 50 micrometers, at least 100 micrometers, at least 200 micrometers, at least 300 micrometers, at least 500 micrometers, at least 1,000 micrometers, at least 2,000 micrometers, at least 3,000 micrometers, at least 5,000 micrometers, or at least 10,000 micrometers.

In addition, in some cases, the mechanical vibrations may be time-varying; for example, the mechanical vibrations may periodically change in amplitude and/or direction, e.g., to facilitate manipulation of the discontinuous fibers. The oscillation may be sinusoidal or another repeating waveform (e.g., square wave or sawtooth). The frequency may be, for example, at least 0.1 Hz, at least 0.3 Hz, at least 0.5 Hz, at least 1 Hz, at least 3 Hz, at least 5 Hz, at least 10 Hz, at least 30 Hz, at least 50 Hz, at least 100 Hz, at least 300 Hz, at least 500 Hz, etc., and/or no more than 1000 Hz, no more than 500 Hz, no more than 300 Hz, no more than 100 Hz, no more than 50 Hz, no more than 30 Hz, no more than 10 Hz, no more than 5 Hz, no more than 3 Hz, etc. For example, the frequency may be between 1 Hz to 500 Hz, between 10 Hz and 30 Hz, between 50 Hz and Hz, or the like. In addition, the frequency may be held substantially constant, or the frequency may vary in some cases. If applied in conjunction with an oscillating magnetic field, their frequencies may independently be the same or different.

During and/or after alignment, the discontinuous fibers may be set or fixed in some embodiments, e.g., to prevent or limit subsequent movement of the discontinuous fibers, in one set of embodiments. Non-limiting examples of techniques include, but are not limited to solidifying, hardening, gelling, melting, heating, evaporating, freezing, lyophilizing, or pressing the liquid or the slurry.

In some cases, the liquid may comprise a relatively volatile solvent, which can be removed by heating and/or evaporation (e.g., by waiting a suitable amount of time, or allowing the solvent to evaporate, e.g., in a fume hood or other ventilated area). Non-limiting examples of volatile solvents include isopropanol, butanol, ethanol, acetone, toluene, or xylenes. Other examples of methods of removing solvents include applying vacuum, lyophilization, mechanical shaking, or the like.

In one set of embodiments, heating may be applied to the discontinuous fibers, for example, to dry the liquid or remove a portion of the solvent. For example, the discontinuous fibers may be heated to a temperature of at least about 30° C., at least about 35° C., at least about 40° C., at least about 45° C., at least about 50° C., at least about 55° C., at least about 60° C., at least about 65° C., at least about 70° C., at least about 75° C., at least about 80° C., at least about 90° C., at least about 100° C., at least about 125° C., at least about 150° C., at least about 175° C., at least about 200° C., at least about 250° C., at least about 300° C., at least about 350° C., at least about 400° C., at least about 450° C., at least about 500° C., etc. Any suitable method of applying heat may be used, for example, a thermoelectric transducer, an Ohmic heater, a Peltier device, a combustion heater, or the like. In some cases, the viscosity of the liquid may decrease as a result of heating. The heating may be applied, for example, prior, concurrent or subsequent to the application of magnetic field and/or mechanical vibration.

Thus, in one set of embodiments, a first coating may be applied onto a plurality of discontinuous fibers, which may be substantially aligned as discussed herein. The first coating may be applied onto at least one surface, or an interior plane, etc., of the plurality of discontinuous fibers as a coating and/or film. The coating may include, for example, a phase change material, polymer, or the like, e.g., as discussed herein. In some cases, the coating may comprise a filler, such as a ceramic, a metal, etc., e.g., as described herein. The coating may be applied to the plurality of discontinuous fibers as discussed herein, for example, using gravity, capillary action, heat, pressure, etc.

In addition, in some embodiments, a second coating may be applied to at least one surface of the composition, e.g., a coating and/or film. The second coating material may comprise the same material as the primary coating, or a different material. The coating may be applied as discussed herein, for example, using gravity, capillary action, heat, pressure, etc., and the same technique, or a different technique, may be used.

In addition, in some aspects, a material such as a metal, for example, solder, or other materials such as those discussed herein, may be added to the discontinuous fibers. A variety of techniques may be used to apply such materials. Non-limiting examples include lamination, material baths, the application of heat and/or pressure, or the like. The material may be applied at any suitable point, e.g., before, during, and/or after formation or alignment of the discontinuous fibers, e.g., to form a substrate. The material may be applied as a liquid in some cases, and may be caused to harden after application to the discontinuous fibers. In certain cases, the material is permeated or interspersed into at least a portion of the discontinuous fibers. The material may also surround at least a portion of the fibers. In some cases, at least a portion or all of the fibers may become embedded within the material. For instance, in some embodiments, one or both ends of the fibers may become embedded within the material. In addition, the material may cover at least a first side of a substrate defined by the discontinuous fibers in certain embodiments.

Non-limiting examples of permeation techniques include using gravitational and capillary forces, by applying pressure to the material to force it into the discontinuous fibers, or the like. In addition, heat may be applied in some embodiments. Additional examples include, but are not limited to, hot-pressing, calendaring, or vacuum infusion. Other techniques can also be used to apply the material. For instance, in one set of embodiments, the discontinuous fibers may be dipped in a bath of material, e.g., a metal or a solder bath. In some cases, the bath may also be heated, e.g., to temperatures such as those discussed herein.

However, in some cases, the material is used to coat all, or only a portion of, the discontinuous fibers, e.g., without necessarily requiring permeation or embedding of the discontinuous fibers completely within the material (although these may also be achieved in yet other embodiments). For instance, in certain embodiments, at least 10%, at least 20%, at least 30%, at least 40%, at least 50%, at least 60%, at least 70%, at least 80%, or at least 90% of the lengths of the discontinuous fibers may not be in contact with the material.

In some embodiments, pressure may be applied to facilitate application of the material. Examples include, but are not limited to, hot-pressing, calendaring, vacuum infusion, pressure infiltration, or the like. For example, pressure may be applied using one or more air or mechanical platens, e.g., applied to the material. (In addition, in some cases, heat may also be applied using such platens.) The pressure that is applied, may be, for example, at least 15 psi (gauge), at least 30 psi, at least 45 psi, etc. (1 psi=6895 Pa). In some embodiments, the pressure may be at least 100 kPa, at least 200 kPa, at least 300 kPa, at least 400 kPa, at least 500 kPa, etc. In addition, some cases, the pressure may also be used to also remove liquid from the discontinuous fibers.

In some embodiments, heat may be applied to facilitate the application of the material. This may be useful, for example, to partially or completely liquefy or soften the material, or facilitate its flow or permeation, e.g., to surround the discontinuous fibers. In some cases, the material may be heated to a temperature greater than the melting point of the material, which may allow the material to flow around and/or permeate the discontinuous fibers.

For example, in one set of embodiments, the material may be heated to temperature of at least 30° C., at least 40° C., at least 50° C., at least 60° C., at least 70° C., at least 80° C., at least 90° C., at least 100° C., at least 110° C., at least 120° C., at least 130° C., at least 140° C., at least 150° C., at least 160° C., at least 170° C., at least 180° C., at least 190° C., at least 200° C., at least 210° C., at least 220° C., at least 230° C., at least 240° C., at least 250° C., etc.

In addition, in certain embodiments, the material may be surrounded by an inert gas (for example, nitrogen, argon, etc.), e.g., when heat and/or pressure are applied.

In another set of embodiments, the metal may be added using deposition processes, such as chemical vapor deposition, physical vapor deposition, thermal chemical vapor deposition, electrothermal induced deposition, or the like. In some cases, heat may be applied, for example, using via current induced joule heating.

In one aspect, a composition such as discussed herein may be used to conduct heat between a first location (e.g., a heat source) and a second location (e.g., a heat sink or a cooling apparatus). The heat source may be any suitable source of heat. For example, in one embodiment, the heat source may be a semiconductor device, e.g., for use in a computer or other electronic device. The semiconductor device may be, for example, a CPU, GPU, RAM module, power transistor, laser, light-emitting diode, photovoltaic cell, or the like. Other heat sources may be used in some embodiments as well. For example, in one embodiment, the heat source may involve a chemical reaction or an electrical system (e.g., resistive heating).

The heat sink or cooling apparatus may be any apparatus able to dissipate heat. As non-limiting examples, the heat sink may include a fluid medium, such as air or a liquid. For example, the heat sink may include a fan to blow air to cool the apparatus, or a pump that applies a liquid coolant. In some cases, the heat sink may include a plurality of fins that the fluid is able to pass through, thereby allowing heat transfer to the fluid to occur in the heat sink. The fins may have any shape, e.g., including pin, straight, flared, slanted, or the like. The fins may have any suitable cross section, including cylindrical, elliptical, square, etc. The heat sink may include materials such as copper, aluminum, or other metals with relatively high heat conductivities.

As discussed, the composition may be used to help thermally communicate a first location to a second location. The composition may be positioned in direct physical contact with one or both of the heat source and the cooling apparatus, and/or there may be other materials that help facilitate the transport of heat from the heat source to the cooling apparatus. Non-limiting examples include thermal tape (e.g., polyimide, graphite, aluminum, etc.), epoxy, grease, solder, silicone coated fabrics, or other thermal interface materials.

The following documents are incorporated herein by reference in their entireties: Int. Pat. Apl. Pub. No. WO 2018/175134, entitled "Fiber-Reinforced Composites, Methods Therefore And Articles Comprising The Same"; Int. Pat. Apl. Pub. No. WO 2020/123334, entitled "Systems and Methods for Carbon Fiber Alignment and Fiber-Reinforced Composites"; Int. Pat. Apl. Pub. No. WO 2021/007381, entitled "Systems and Methods for Forming Short-Fiber Films, Composites Comprising Thermosets, and Other Composites"; Int. Pat. Apl. Pub. No. WO 2021/007389, entitled "Compositions and Methods for Carbon Fiber-Metal Composites"; and U.S. Pat. Apl. Ser. No. 63/314,808, entitled "Thermally Conductive Aligned Materials and Methods of Making and Use Thereof." In addition, U.S. Provisional Patent Application Ser. No. 63/398,190, filed Aug. 15, 2022, entitled "Thermal Interface Materials Comprising Aligned Fibers and Materials Such As Solders, Alloys, and/or Other Metals, is incorporated herein by reference in its entirety.

The following examples are intended to illustrate certain embodiments of the present disclosure, but do not exemplify the full scope of the disclosure.

Example 1

In this example, infiltration of carbon fibers using indium was demonstrated. 2 inch×2 inch sheets of indium alloy (5 cm×5 cm) were scraped with a steel razor blade, and cleaned with isopropyl alcohol. The sheets of indium, 0.01 inch (0.254 mm) thick, and a substrate formed from aligned carbon fibers were pressed together using a static press machine in a 120 mbar vacuum environment and 200° C. temperature for 1 hour. The material was then allowed to cool down to 45° C. temperature, prior to removing the pressure.

Figure 4:
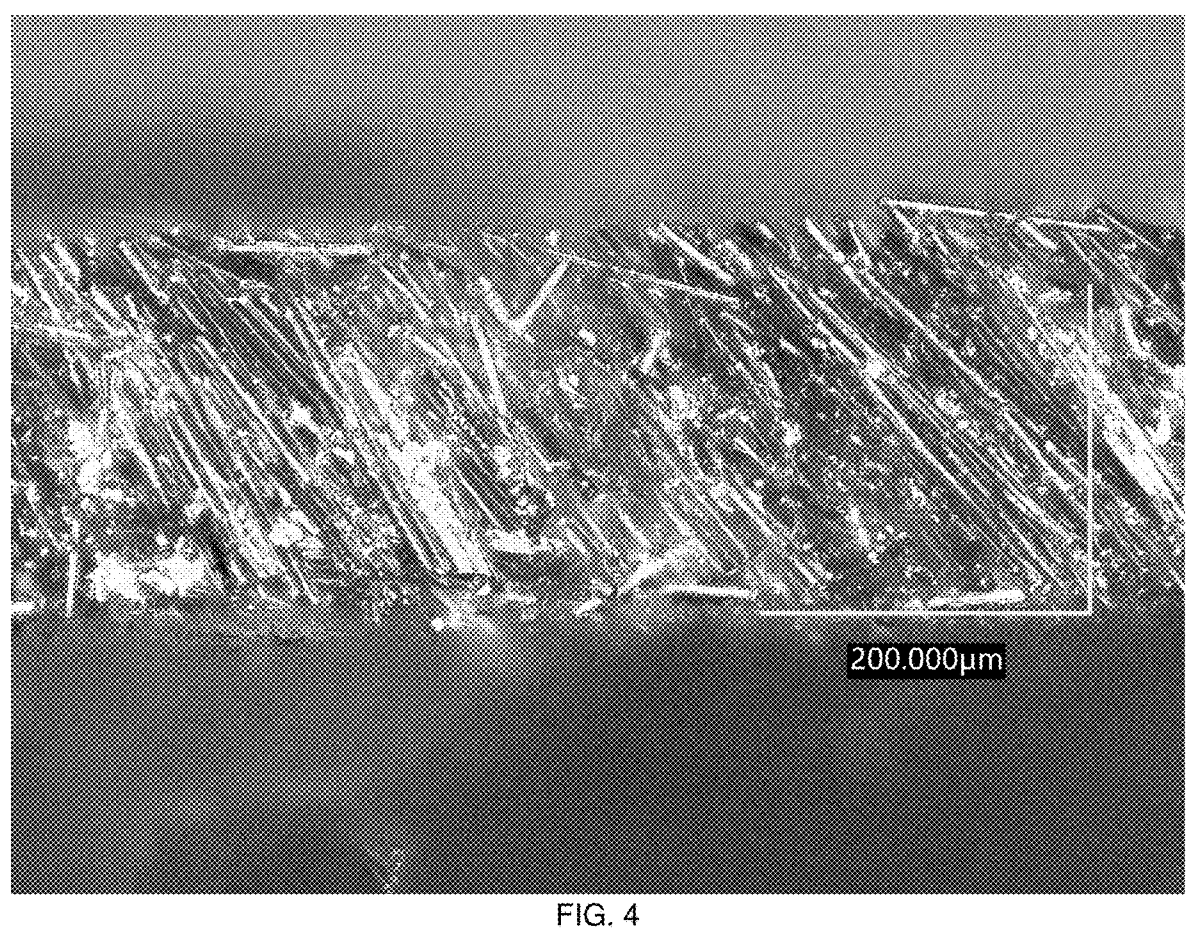
FIG. 4 is a photomicrograph illustrating carbon fibers infiltrated with indium, in one embodiment.

Infiltration of the substrate was found, along with indium on both sides of the substrate. Cross section images revealed there was at least 10% impregnation throughout the fibers, e.g., as shown in FIG. 4.

Example 2

Figure 5:
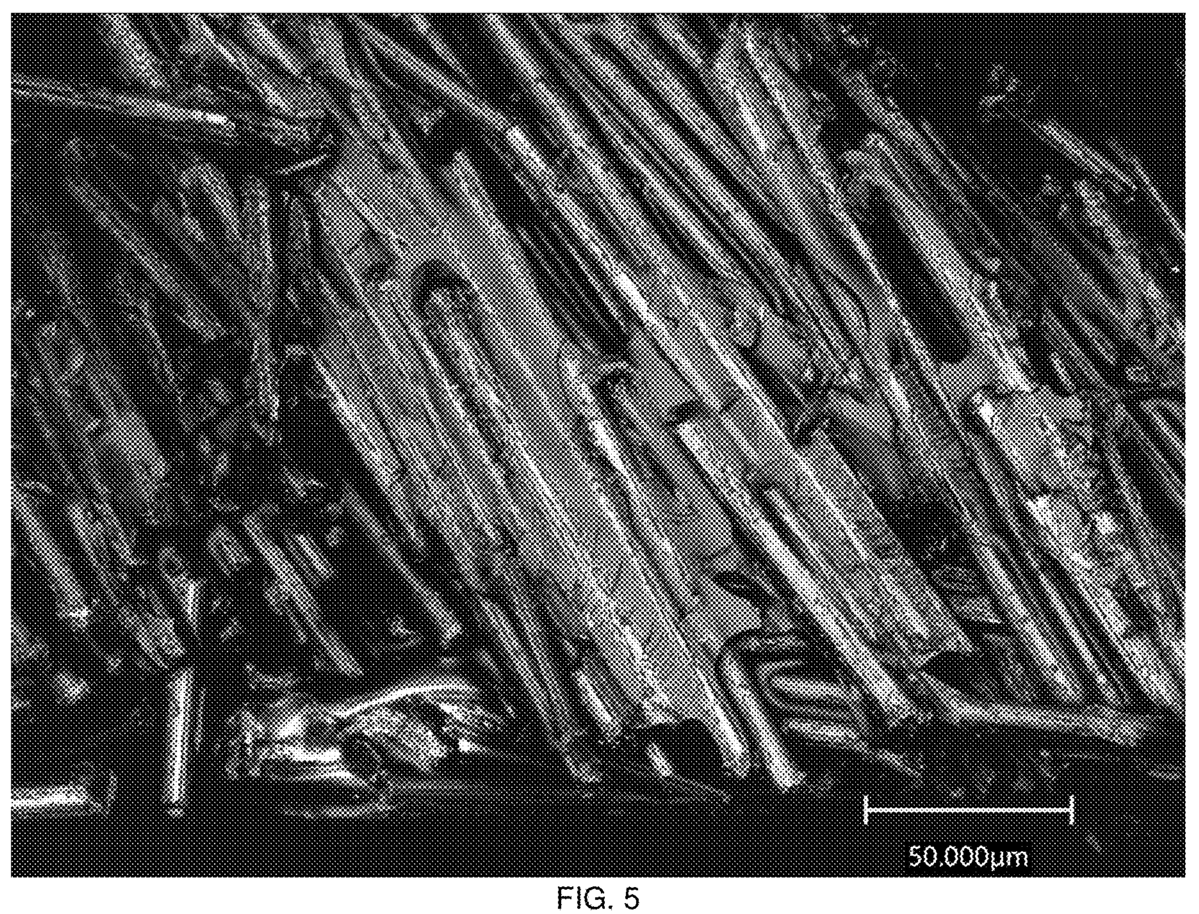
FIG. 5 is a photomicrograph illustrating carbon fibers infiltrated with indium, in another embodiment.
Figures 6A, 6B:
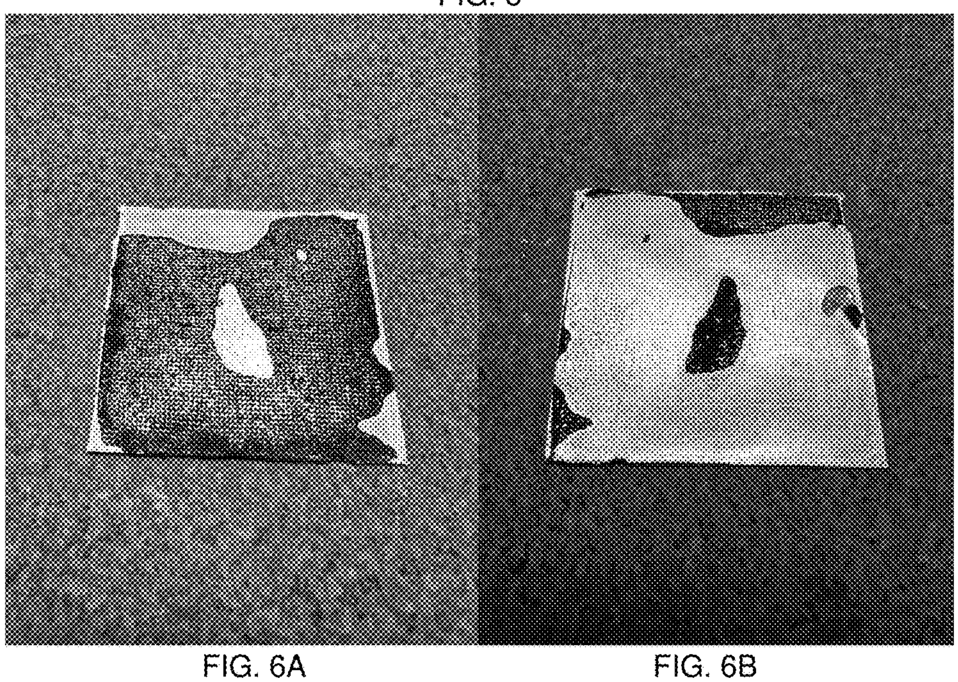
FIGS. 6A-6B are photomicrographs illustrating carbon fibers infiltrated with indium, in still another embodiment.

This example illustrates the application of low-temperature lead-free soldering flux on an indium sheet on a substrate formed from aligned carbon fibers to demonstrate that indium solder was able to wet the carbon fibers. The substrate formed from aligned carbon fibers was infiltrated using 0.01 inch (0.254 mm) thick indium sheets with solder flux obtained from Alpha Metals. This infiltration is shown in FIG. 5. A nitrogen environment and a static press that had side barriers on the press itself to keep the indium from spreading was used. This infiltration is shown in FIGS. 6A and 6B.

While several embodiments of the present disclosure have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present disclosure. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present disclosure is/are used. Those skilled in the art will recognize, or be able to ascertain using no more than routine experimentation, many equivalents to the specific embodiments of the disclosure described herein. It is, therefore, to be understood that the foregoing embodiments are presented by way of example only and that, within the scope of the appended claims and equivalents thereto, the disclosure may be practiced otherwise than as specifically described and claimed. The present disclosure is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When the word "about" is used herein in reference to a number, it should be understood that still another embodiment of the disclosure includes that number not modified by the presence of the word "about."

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A composition, comprising:

a plurality of discontinuous fibers defining a substrate, wherein the plurality of discontinuous fibers comprise carbon fibers having an average diameter of at least 5 micrometers, and at least 30 vol % of the discontinuous fibers within the substrate are substantially aligned; and a solder in contact with the plurality of discontinuous fibers, wherein at least some of the solder is interspersed with the plurality of discontinuous fibers, and the plurality of discontinuous fibers is more thermally conductive than the solder.

2. The composition of claim 1, wherein the solder comprises a transition metal rich solder alloy.

3. The composition of claim 1, wherein the solder comprises an oxide coated liquid metal.

4. The composition of claim 1, wherein the solder comprises an oxide coated liquid metal transition metal rich solder alloy.

5. The composition of claim 1, wherein the solder comprises a thermal chemical vapor deposited metal.

6. The composition of claim 1, wherein the solder is contained within a conductive medium.

7. The composition of claim 1, wherein at least some of the solder covers a first side of the substrate.

8. The composition of claim 1, wherein at least some of the solder surrounds the plurality of discontinuous fibers.

9. The composition of claim 1, wherein the solder has a melting temperature of no more than 265° C.

10. The composition of claim 1, wherein the solder comprises nickel.

11. The composition of claim 1, further comprising solder flux in contact with the solder.

12. The composition of claim 1, wherein the carbon fibers have a carbon content greater than 94% and a modulus of at least 200 GPa.

13. The composition of claim 1, wherein at least 30% of the lengths of the discontinuous fibers are in contact with the solder.

14. The composition of claim 1, wherein at least 50 vol % of the discontinuous fibers have an alignment that is within 45° of the average alignment of the plurality of discontinuous fibers.

15. The composition of claim 1, wherein the composition has an overall heat conductivity of at least 30 W/m K.

16. The composition of claim 1, wherein the composition exhibits anisotropic heat conductivity.

17. A device, comprising the composition of claim 1, wherein the composition is in thermal communication with a heat source and a cooling apparatus.

* * * * *